US010935894B2

(12) United States Patent
Aoki

(10) Patent No.: US 10,935,894 B2
(45) Date of Patent: *Mar. 2, 2021

(54) MOVABLE BODY APPARATUS, EXPOSURE APPARATUS, MANUFACTURING METHOD OF FLAT-PANEL DISPLAY AND DEVICE MANUFACTURING METHOD, AND MOVEMENT METHOD OF OBJECT

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/695,746

(22) Filed: Nov. 26, 2019

(65) Prior Publication Data

US 2020/0096879 A1   Mar. 26, 2020

Related U.S. Application Data

(63) Continuation of application No. 15/763,429, filed as application No. PCT/JP2016/078847 on Sep. 29, 2016, now Pat. No. 10,520,834.

(30) Foreign Application Priority Data

Sep. 30, 2015   (JP) .............................. JP2015-192791

(51) Int. Cl.
  *G03F 7/20*   (2006.01)
  *G03F 9/00*   (2006.01)
  *H01L 21/68*  (2006.01)

(52) U.S. Cl.
  CPC .......... *G03F 7/70775* (2013.01); *G03F 7/707* (2013.01); *G03F 7/7085* (2013.01);
  (Continued)

(58) Field of Classification Search
  CPC ............. G03F 7/70725; G03F 7/70758; G03F 7/70775; G03F 7/7085; G03F 9/70; H01L 21/68
  (Continued)

(56) References Cited

U.S. PATENT DOCUMENTS

| 5,729,331 A  | 3/1998 | Tanaka et al. |
| 6,552,775 B1 | 4/2003 | Yanagihara et al. |

(Continued)

FOREIGN PATENT DOCUMENTS

JP   2011-044713 A   3/2011

OTHER PUBLICATIONS

Dec. 20, 2016 International Search Report issued in International Patent Application No. PCT/JP2016/078847.
(Continued)

*Primary Examiner* — Colin W Kreutzer
(74) *Attorney, Agent, or Firm* — Oliff PLC

(57) ABSTRACT

A substrate stage device that moves a substrate has: a noncontact holder that supports the substrate in a noncontact manner; a first drive section that moves the noncontact holder; scale plates that serve as a reference of movement of the noncontact holder; a first measurement section that has scale plates and Y heads, one of the scale plates and the Y heads being provided at the noncontact holder and the other of the scale plates and the Y heads being provided between the scale plates and the noncontact holder, and that measures position information of the Y heads; a second measurement section that measures position information of the other of the scale plates and the Y heads; and a position measurement system that obtains position information of the noncontact holder on the basis of the position information measured by the first and the second measurement sections.

13 Claims, 12 Drawing Sheets

(52) U.S. Cl.
CPC ...... *G03F 7/70725* (2013.01); *G03F 7/70758* (2013.01); *G03F 9/70* (2013.01); *H01L 21/68* (2013.01)

(58) Field of Classification Search
USPC ..... 310/12.05, 12.06, 12.19; 355/53, 72, 75, 355/77; 356/399–401, 616
See application file for complete search history.

(56) References Cited

U.S. PATENT DOCUMENTS

| | | |
|---|---|---|
| 10,520,834 B2 * | 12/2019 | Aoki ................. H01L 21/68 |
| 2008/0030702 A1 | 2/2008 | Kawamura |
| 2008/0094592 A1 | 4/2008 | Shibazaki |
| 2008/0240501 A1 | 10/2008 | Van Der Wijst et al. |
| 2008/0319569 A1 | 12/2008 | Loopstra et al. |
| 2009/0231561 A1 | 9/2009 | Arai |
| 2009/0316124 A1 | 12/2009 | Kwan |
| 2010/0018950 A1 | 1/2010 | Aoki et al. |
| 2010/0261106 A1 | 10/2010 | Kobayashi |
| 2010/0266961 A1 | 10/2010 | Kawamura et al. |
| 2011/0026004 A1 | 2/2011 | Van Eijk et al. |
| 2011/0042874 A1 | 2/2011 | Aoki et al. |
| 2011/0053092 A1 | 3/2011 | Aoki |
| 2012/0050709 A1 | 3/2012 | Van Der Pasch et al. |
| 2012/0057140 A1 | 3/2012 | Aoki |
| 2013/0194586 A1 | 8/2013 | Van Eijk et al. |
| 2013/0293889 A1 | 11/2013 | Emoto et al. |
| 2015/0168852 A1 | 6/2015 | Beerens et al. |
| 2018/0059555 A1 | 3/2018 | Westerlaken et al. |
| 2018/0284619 A1 | 10/2018 | Shirato et al. |
| 2018/0356739 A1 | 12/2018 | Aoki et al. |
| 2018/0364595 A1 | 12/2018 | Shirato |
| 2019/0025708 A1 | 1/2019 | Shirato et al. |

OTHER PUBLICATIONS

Dec. 20, 2016 Written Opinion of the International Searching Authority issued in International Patent Application No. PCT/JP2016/078847.

* cited by examiner

MOVABLE BODY APPARATUS, EXPOSURE APPARATUS, MANUFACTURING METHOD OF FLAT-PANEL DISPLAY AND DEVICE MANUFACTURING METHOD, AND MOVEMENT METHOD OF OBJECT

This application is a Continuation of application Ser. No. 15/763,429, filed Mar. 26, 2018, which is a national stage of PCT/JP2016/078847, filed Sep. 29, 2016, which claims priority to JP 2015-192791, filed Sep. 30, 2015. The contents of the prior applications are incorporated by reference herein in their entireties.

TECHNICAL FIELD

The present invention relates to movable body apparatuses, exposure apparatuses, manufacturing methods of flat-panel displays and device manufacturing methods, and movement methods of objects, and more particularly to a movable body apparatus and a movement method for moving an object, an exposure apparatus including the movable body apparatus, a manufacturing method of flat-panel displays or a device manufacturing method using the exposure apparatus.

BACKGROUND ART

Conventionally, in a lithography process for manufacturing electronic devices (micro devices) such as liquid crystal display devices and semiconductor devices (integrated circuits and the like), used are exposure apparatuses such as an exposure apparatus of a step-and-scan method (a so-called scanning stepper (which is also called a scanner)) that, while synchronously moving a mask or a reticle (hereinafter, generically referred to as a "mask") and a glass plate or a wafer (hereinafter, generically referred to as a "substrate") along a predetermined scanning direction, transfers a pattern formed on the mask onto the substrate using an energy beam.

As this type of exposure apparatuses, such an exposure apparatus is known that is equipped with an optical interferometer system that obtains position information of a substrate serving as an exposure target, within a horizontal plane, using a bar mirror (a long mirror) that a substrate stage device has (e.g., refer to PTL 1).

Here, in the case of obtaining position information of a substrate using the optical interferometer system, the influence of so-called air fluctuation cannot be ignored.

CITATION LIST

Patent Literature

[PTL 1] U.S. Patent Application Publication No. 2010/0266961

SUMMARY OF INVENTION

According to a first aspect of the present invention, there is provided a movable body apparatus, comprising: a support section that supports an object in a noncontact manner; a holding section that holds the object supported in a noncontact manner by the support section; a first drive section that moves the holding section in a first direction and a second direction intersecting each other; a reference member serving as a reference of movement of the holding section in the first and the second directions; a first measurement section having a first grating section that has a measurement component in the first direction and a first head that is disposed to face the first grating section and irradiates the first grating section with a measurement beam, the first measurement section measuring position information of the first head by the first head and the first grating section, one of the first grating section and the first head being provided at the holding section and the other of the first grating section and the first head being provided between the reference member and the holding section; a second measurement section that measures position information of the other of the first grating section and the first head; and a position measurement system that obtains position information, in the first and the second directions, of the holding section that holds the object, based on the position information measured by the first and the second measurement sections.

According to a second aspect of the present invention, there is provided an exposure apparatus, comprising: the movable body apparatus related to the first aspect; and a pattern forming device that forms a predetermined pattern on the object using an energy beam.

According to a third aspect of the present invention, there is provided a manufacturing method of a flat-panel display, comprising: exposing the object using the exposure apparatus related to the second aspect; and developing the object that has been exposed.

According to a fourth aspect of the present invention, there is provided a device manufacturing method, comprising: exposing the object using the exposure apparatus related to the second aspect; and developing the object that has been exposed.

According to a fifth aspect of the present invention, there is provided a movement method of an object, comprising: supporting an object in a noncontact manner, by a support section; holding the object supported in a noncontact manner by the support section, by a holding section; moving the holding section in a first direction and a second direction intersecting each other, by a first drive section; by a first measurement section having a first grating section that has a measurement component in the first direction and a first head that is disposed to face the first grating section and irradiates the first grating section with a measurement beam, measuring position information of the first head using the first head and the first grating section, one of the first grating section and the first head being provided at the holding section and the other of the first grating section and the first head being provided between a reference member and the holding section, and the reference member serving as a reference of movement of the holding section in the first and the second directions; measuring position information of the other of the first grating section and the first head, by a second measurement section; and obtaining position information, in the first and the second directions, of the holding section that holds the object, based on the position information measured by the first and the second measurement sections.

DESCRIPTION OF EMBODIMENTS

First Embodiment

A first embodiment will be described below, using FIGS. 1 to 10b.

Figure 1:
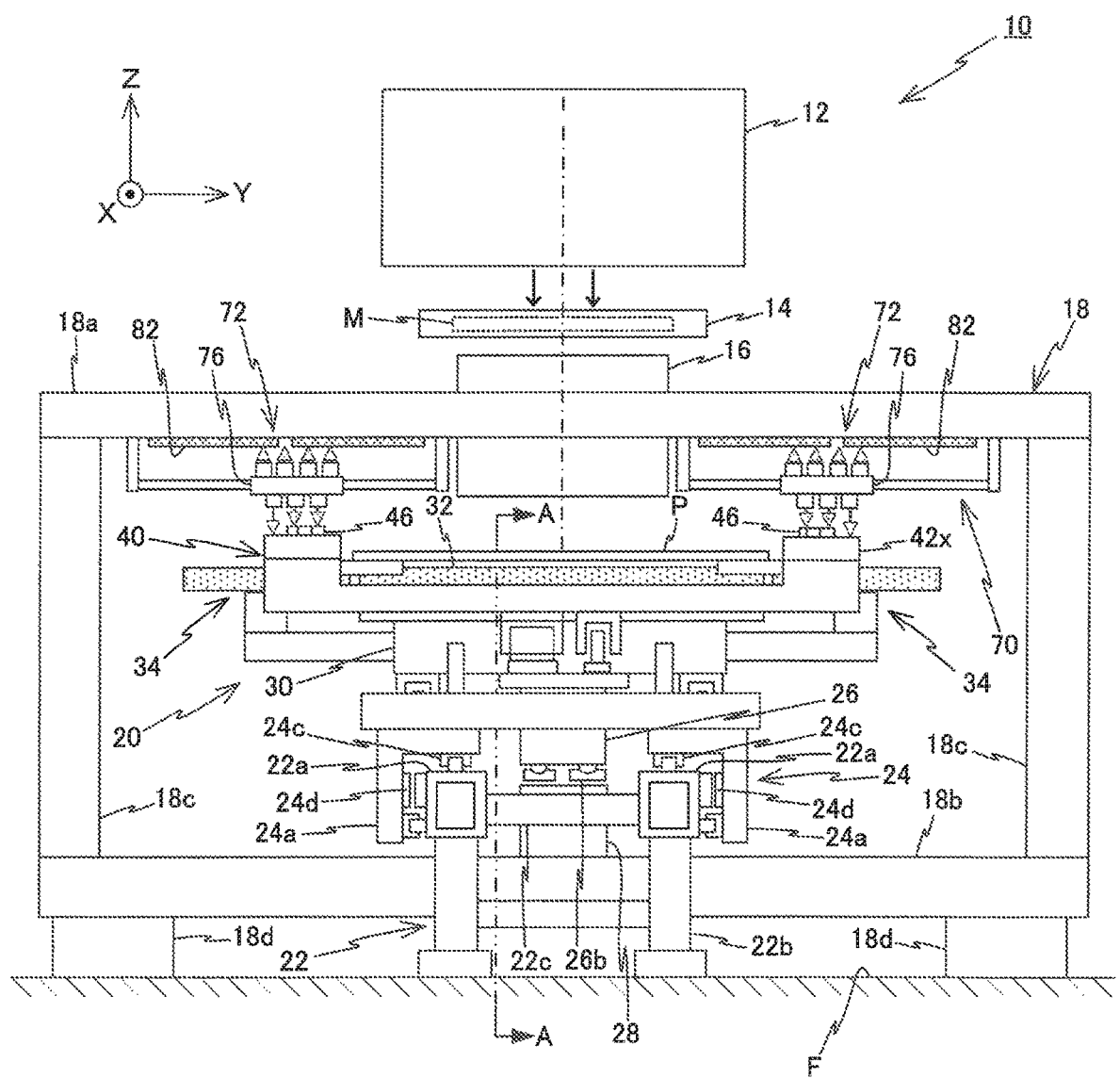
FIG. 1 is a view schematically showing a configuration of a liquid crystal exposure apparatus related a first embodiment.

FIG. 1 schematically shows the configuration of a liquid crystal exposure apparatus 10 related to the first embodiment. Liquid crystal exposure apparatus 10 is a projection exposure apparatus of a step-and-scan method, which is a so-called scanner, with a rectangular (square) glass substrate P (hereinafter, simply referred to as a substrate P) used in, for example, a liquid crystal display device (a flat-panel display) or the like, serving as an object to be exposed.

Liquid crystal exposure apparatus 10 has: an illumination system 12; a mask stage 14 to hold a mask M on which patterns such as a circuit pattern are formed; a projection optical system 16; an apparatus main body 18; a substrate stage device 20 to hold substrate P whose surface (a surface facing the +Z side in FIG. 1) is coated with resist (sensitive agent); a control system thereof; and the like. Hereinafter, the explanation is given assuming that a direction in which mask M and substrate P are each scanned relative to projection optical system 16 at the time of exposure is an X-axis direction, a direction orthogonal to the X-axis within a horizontal plane is a Y-axis direction, and a direction orthogonal to the X-axis and the Y-axis is a Z-axis direction. Further, the explanation is given assuming that rotation directions around the X-axis, the Y-axis and the Z-axis are a θx direction, a θy direction and a θz direction, respectively.

Illumination system 12 is configured similarly to an illumination system disclosed in, for example, U.S. Pat. No. 5,729,331 and the like. That is, illumination system 12 irradiates mask M with light emitted from a light source (not illustrated) (e.g. a mercury lamp), as illumination light for exposure (illumination light) IL, via a reflection mirror, a dichroic mirror, a shutter, a wavelength selecting filter, various types of lenses and the like (none of which are illustrated). As illumination light IL, light such as, for example, an i-line (with wavelength of 365 nm), a g-line (with wavelength of 436 nm), and an h-line (with wavelength of 405 nm) (or synthetic light of the i-line, the g-line and the h-line described above) is used.

Mask stage 14 holds mask M of a light-transmitting type. Main controller 50 (see FIG. 6) drives mask stage 14 (i.e. mask M) with a predetermined long stroke relative to illumination system 12 (illumination light IL) in the X-axis direction (the scanning direction), and also finely drives mask stage 14 in the Y-axis direction and the θz direction, via a mask stage drive system 52 (see FIG. 6) including, for example, a liner motor. Position information of mask stage 14 within the horizontal plane is obtained by a mask stage position measurement system 54 (see FIG. 6) including, for example, a laser interferometer.

Projection optical system 16 is disposed below mask stage 14. Projection optical system 16 is a so-called multi-lens type projection optical system having a configuration similar to a projection optical system disclosed in, for example, U.S. Pat. No. 6,552,775 and the like, and projection optical system 16 is equipped with a plurality of optical systems that are, for example, both-side telecentric and form erected normal images. An optical axis AX of illumination light IL projected on substrate P from projection optical system 16 is parallel to the Z-axis.

In liquid crystal exposure apparatus 10, when mask M located in an illumination area is illuminated with illumination light IL from illumination system 12, by illumination light IL that has passed through mask M, a projected image of a pattern (a partial image of the pattern) of mask M within the illumination area is formed on an exposure area on substrate P, via projection optical system 16. Then, mask M is moved relative to the illumination area (illumination light IL) in the scanning direction and also substrate P is moved relative to the exposure area (illumination light IL) in the scanning direction, and thereby the scanning exposure of one shot area on substrate P is performed and the pattern formed on mask M (the entire pattern corresponding to the scanning range of mask M) is transferred onto the shot area. Here, the illumination area on mask M and the exposure area (an irradiation area of the illumination light) on substrate P are in a relationship optically conjugate with each other by projection optical system 16.

Apparatus main body 18 is a section that supports mask stage 14 and projection optical system 16 that are described above, and is installed on a floor F of a clean room via a plurality of vibration isolating devices 18d. Apparatus main body 18 is configured similarly to an apparatus main body as disclosed in, for example, U.S. Patent Application Publication No. 2008/0030702, and apparatus main body 18 has: an upper mount section 18a (which is also referred to as an optical surface plate) that supports projection optical system 16 described above; a pair of lower mount sections 18b (one of which is not illustrated in FIG. 1 because the pair of lower mount sections 18b overlap in a depth direction of the paper surface. See FIG. 2); and a pair of middle mount sections 18c.

Substrate stage device 20 is a section that performs the high accuracy positioning of substrate P relative to projection optical system 16 (illumination light IL), and substrate stage device 20 drives substrate P with a predetermined long stroke along the horizontal plane (the X-axis direction and the Y-axis direction), and also finely drives substrate P in directions of six degrees of freedom. Substrate stage device 20 is equipped with a base frame 22, a coarse movement stage 24, a weight cancelling device 26, an X guide bar 28, a substrate table 30, a noncontact holder 32, a pair of auxiliary tables 34, a substrate carrier 40 and the like.

Base frame 22 is equipped with a pair of X beams 22a. X beam 22a is made up of a member with a rectangular YZ cross-sectional shape extending in the X-axis direction. The pair of X beams 22a are disposed at a predetermined spacing in the Y-axis direction, and the pair of X beams 22 are each installed on floor F via a leg section 22b, in a state of being physically separated (vibrationally isolated) from apparatus main body 18. Each of the pair of X beams 22a and each of leg sections 22b are integrally coupled by a coupling member 22C.

Coarse movement stage 24 is a section for driving substrate P with a long stroke in the X-axis direction, and coarse movement stage 24 is equipped with a pair of X carriages 24a, corresponding to the pair of X beams 22a described above. X carriage 24a is formed into an inversed L-like YZ cross-sectional shape, and is placed on the corresponding X beam 22a via a plurality of mechanical linear guide devices 24c.

Figure 2:
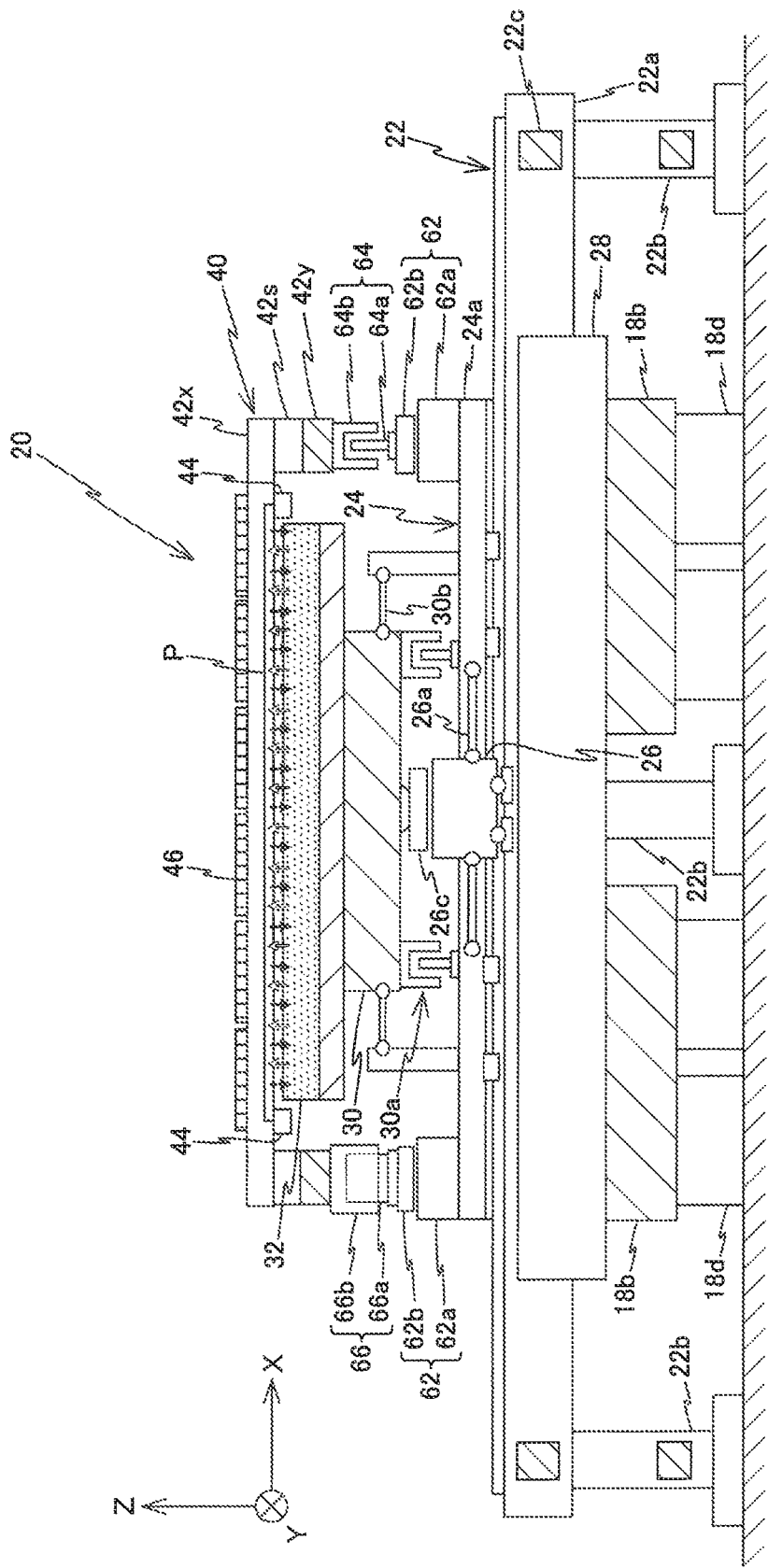
FIG. 2 is a cross-sectional view taken along the line A-A shown in FIG. 1.

The pair of X carriages 24a are synchronously driven with a predetermined long stroke in the X-axis direction (about 1 time to 1.5 times the length of substrate P in the X-axis direction) along the respective corresponding X beams 22a, by main controller 50 (see FIG. 6) via an X linear actuator that is a part of a substrate table drive system 56 (see FIG. 6) for driving substrate table 30. The type of the X linear actuator for driving X carriage 24a can be changed as needed. In FIG. 2, for example, a linear motor 24d including a mover that X carriage 24a has and a stator that the corresponding X beam 22a has is used, but this is not intended to be limiting, and for example, a feed screw (a ball screw) device or the like may be used.

Further, as illustrated in FIG. 2, coarse movement stage 24 has a pair of Y stators 62a. Y stators 62a are made up of members extending in the Y-axis direction (see FIG. 1). One of Y stators 62a and the other of Y stators 62a bridge on the pair of X carriages 24a, respectively, at the +X side end vicinity part of coarse movement stage 24 and the −X side end vicinity part of coarse movement stage 24a (see FIG. 1). The functions of Y stators 62a will be described later.

Weight cancelling device 26 is inserted between the pair of X carriages 24a that coarse movement stage 24 has, and supports the empty weight of a system including substrate table 30 and noncontact holder 32, from below. Since the details of weight cancelling device 26 are disclosed in, for example, U.S. Patent Application Publication No. 2010/0018950, the description thereof will be omitted. Weight cancelling device 26 is mechanically coupled to coarse movement stage 24, via a plurality of coupling devices 26a (which are also referred to as flexure devices) radially extending from weight cancelling device 26, and weight cancelling device 26 is towed by coarse movement stage 24, thereby being moved integrally with coarse movement stage 24 in the X-axis direction. Note that, although weight cancelling device 26 is to be coupled to coarse movement stage 24 via coupling devices 26a radially extending from weight cancelling device 26, such a configuration may also be employed that weight cancelling device 26 is coupled by coupling devices 26a extending in the X direction in order to be moved only in the X-axis direction.

X guide bar 28 is a section that functions as a surface plate when weight cancelling device 26 is moved. X guide bar 28 is made up of a member extending in the X-axis direction, and as illustrated in FIG. 1, X guide bar 28 is inserted between the pair of X beams 22a that base frame 22 has, and is fixed on the pair of lower mount sections 18b that apparatus main body 18 has. The center of X guide bar 28 in the Y-axis direction substantially coincides with the center of the exposure area generated on substrate P by illumination light IL in the Y-axis direction. The upper surface of X guide bar 28 is set parallel to the XY plane (the horizontal plane). Weight cancelling device 26 described above is placed on X guide bar 28 in a noncontact state, for example, via air bearings 26b. When coarse movement stage 24 is moved in the X-axis direction on base frame 22, weight cancelling device 26 is moved in the X-axis direction on X guide bar 28.

Substrate table 30 is made up of a plate-like (or box-like) member having a rectangular shape with the X-axis direction serving as a longitudinal direction in planar view, and as illustrated in FIG. 2, is supported in a noncontact manner from below by weight cancelling device 26 in a state where the central part is freely swingable with respect to the XY plane via a spherical bearing device 26c. Further, as illustrated in FIG. 1, the pair of auxiliary tables 34 (not illustrated in FIG. 2) are coupled to substrate table 30. The functions of the pair of auxiliary tables 34 will be described later.

Referring back to FIG. 2, substrate table 30 is finely driven as needed relative to coarse movement stage 24, in directions intersecting the horizontal plane (the XY plane), i.e., the Z-axis direction, the θx direction and the θy direction (hereinafter, referred to Z-tilt directions), by a plurality of linear motors 30a (e.g. voice coil motors) that are a part of substrate table drive system 56 (see FIG. 6) and include stators that coarse movement stage 24 has and movers that substrate table 30 itself has.

Substrate table 30 is mechanically coupled to coarse movement stage 24 via a plurality of coupling devices 30b (flexure devices) radially extending from substrate table 30. Coupling devices 30b include, for example, boll joints, and are arranged so as not to block the relative movement of substrate table 30 with a fine stroke in the Z-tilt directions with respect to coarse movement stage 24. Further, in the case when coarse movement stage 24 is moved with a long stroke in the X-axis direction, substrate table 30 is towed by coarse movement stage 24 via the plurality of coupling devices 30b, and thereby coarse movement stage 24 and substrate table 30 are integrally moved in the X-axis direction. Note that, since substrate table 30 is not moved in the Y-axis direction, substrate table 30 may be coupled to coarse movement stage 24 via a plurality of coupling devices 30b parallel to the X-axis direction, instead of coupling devices 30b radially extending to coarse movement stage 24.

Noncontact holder 32 is made up of a plate-like (or box-like) member having a rectangular shape with the X-axis direction serving as a longitudinal direction in planar view, and supports substrate P from below with its upper surface. Noncontact holder 32 has a function of preventing the sag, wrinkle or the like of substrate P from being generated (of performing flatness correction of substrate P). Noncontact holder 32 is fixed to the upper surface of substrate table 30, and is moved with a long stroke integrally with substrate table 30 described above in the X-axis direction and is also finely moved in the Z-tilt directions.

The length of each of the four sides of the upper surface (the substrate supporting surface) of noncontact holder 32 is set substantially the same as (actually, slightly shorter than) the length of each of the four sides of substrate P. Consequently, noncontact holder 32 can support substantially the entirety of substrate P from below, or more specifically, can support an area to be exposed on substrate P (an area excluding margin areas that are formed at the end vicinity parts of substrate P) from below.

A pressurized gas supply device and a vacuum suction device (not illustrated) that are installed external to substrate stage device 20 are coupled to noncontact holder 32 via piping members such as, for example, tubes. Further, a plurality of minute hole sections that communicate with the piping members referred to above are formed on the upper surface (the substrate placing surface) of noncontact holder 32. Noncontact holder 32 blows out the pressurized gas (e.g. the compressed air) supplied from the pressurized gas supply device described above to the lower surface of substrate P via (apart of) the hole sections, thereby levitating substrate P. Further, together with the blowing-out of the pressurized gas described above, noncontact holder 32 suctions the air between the lower surface of substrate P and the substrate supporting surface by a vacuum suction force supplied from the vacuum suction device described above. Accordingly, the load (the preload) acts on substrate P, and the flatness correction of substrate P is performed along the upper surface of noncontact holder 32. However, the relative movement of substrate P and noncontact holder 32 in directions parallel to the horizontal plane is not blocked because a gap is formed between substrate P and noncontact holder 32.

Substrate carrier 40 is a section that holds substrate P, and moves substrate P relative to illumination light IL (see FIG. 1) in directions of three degrees of freedom within the horizontal plane (the X-axis direction, the Y-axis direction and the θz direction). Substrate carrier 40 is formed into a rectangular frame-like (a picture-frame-like) shape in planar view, and is moved relative to noncontact holder 32 along the XY plane in a state of holding the areas (the margin areas) at the end vicinity parts (the outer periphery edges) of substrate P. The details of substrate carrier 40 will be described below using FIG. 3.

Figure 3:
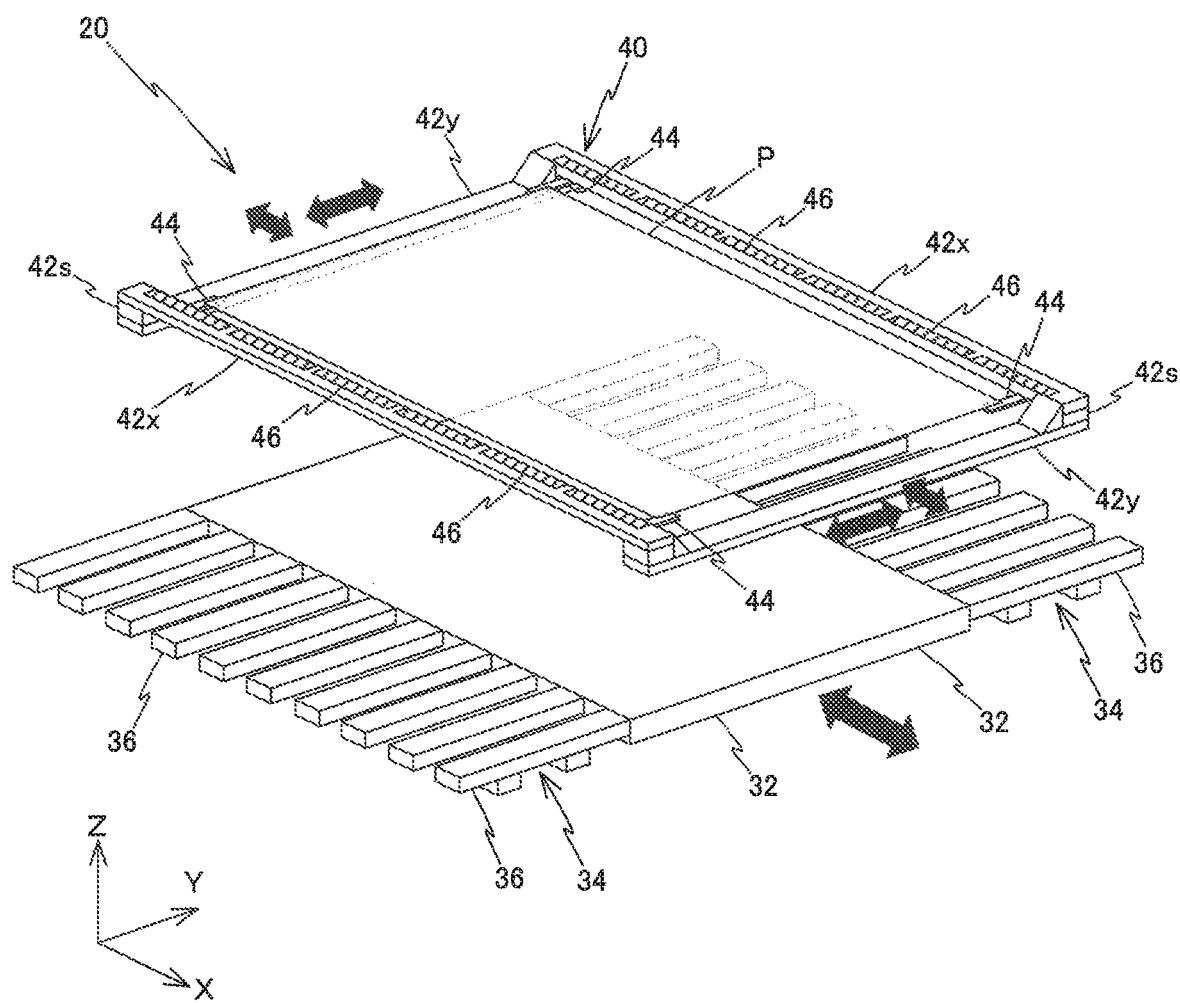
FIG. 3 is a view showing the details of a substrate stage device equipped in the liquid crystal exposure apparatus shown in FIG. 1.

As illustrated in FIG. 3, substrate carrier 40 is equipped with a pair of X frames 42x and a pair of Y frames 42y. The pair of X frames 42x are each made up of a tabular member extending in the X-axis direction, and are disposed at a predetermined spacing in the Y-axis direction (the spacing wider than the size of substrate P and the size of noncontact holder 32 in the Y-axis direction). Further, the pair of Y frames 42y are each made up of a tabular member extending in the Y-axis direction, and are disposed at a predetermined spacing in the X-axis direction (the spacing wider than the size of substrate P and the size of noncontact holder 32 in the X-axis direction).

Y frame 42y on the +X side is coupled, via a spacer 42s, to the lower surface of the +X side end vicinity part of each of the pair of X frames 42x. Similarly, Y frame 42y on the −X side is coupled, via a spacer 42s, to the lower surface of the −X side end vicinity part of each of the pair of X frames 42x. Accordingly, the height positions (the positions in the Z-axis direction) of the upper surfaces of the pair of Y frames 42y are set lower (on the −Z side) than the height positions of the lower surface of the pair of X frames 42x.

Further, on the lower surface of each of the pair of X frames 42x, a pair of adsorption pads 44 are attached, spaced apart from each other in the X-axis direction. Consequently, substrate carrier 40 has, for example, four adsorption pads 44 in total. Adsorption pads 44 are disposed protruding from the surfaces of the pair of X frames 42x facing each other, toward directions opposing to each other (the inner sides of substrate carrier 40). For example, the positions of the four adsorption pads 44 within the horizontal plane (the attached positions with respect to X frames 42x) are set so that the four adsorption pads 44 can support the four corner vicinity parts (the margin areas) of substrate P from below in a state where substrate P is inserted between the pair of X frames 42x. For example, a vacuum suction device (not illustrated) is coupled to each of the four adsorption pads 44. Adsorption pads 44 adsorb and hold the lower surface of substrate P by vacuum suction forces supplied from the vacuum suction devices descried above. Note that the number of adsorption pads 44 is not limited to four, but can be changed as needed.

Here, as illustrated in FIG. 2, in a state where noncontact holder 32 and substrate carrier 40 are combined, the four corner vicinity parts of substrate P are supported (held by adsorption) from below by adsorption pads 44 that substrate carrier 40 has, and also the substantially entire surface including the central part of substrate P is supported from below by noncontact holder 32 in a noncontact manner. In this state, the +X side end and the −X side end of substrate P protrude from the +X side end and the −X side end of noncontact holder 32, and for example, the four adsorption pads 44 (a part of which is not illustrated in FIG. 2) adsorb and hold the portions of substrate P protruding from noncontact holder 32. That is, the attached positions of adsorption pads 44 with respect to X frames 42x are set so that adsorption pads 44 are located on the outer side with respect to noncontact holder 32 in the X-axis direction.

Next, a substrate carrier drive system 60 (see FIG. 6) for driving substrate carrier 40 will be described. In the present embodiment, main controller 50 (see FIG. 6) drives substrate carrier 40 with a long stroke relative to noncontact holder 32 in the Y-axis direction and also finely drives substrate carrier 40 in the directions of three degrees of freedom within the horizontal plane, via substrate carrier drive system 60. Further, main controller 50 drives noncontact holder 32 and substrate carrier 40 integrally (synchronously) in the X-axis direction via substrate table drive system 56 described above (see FIG. 6) and substrate carrier drive system 60.

Figure 4:
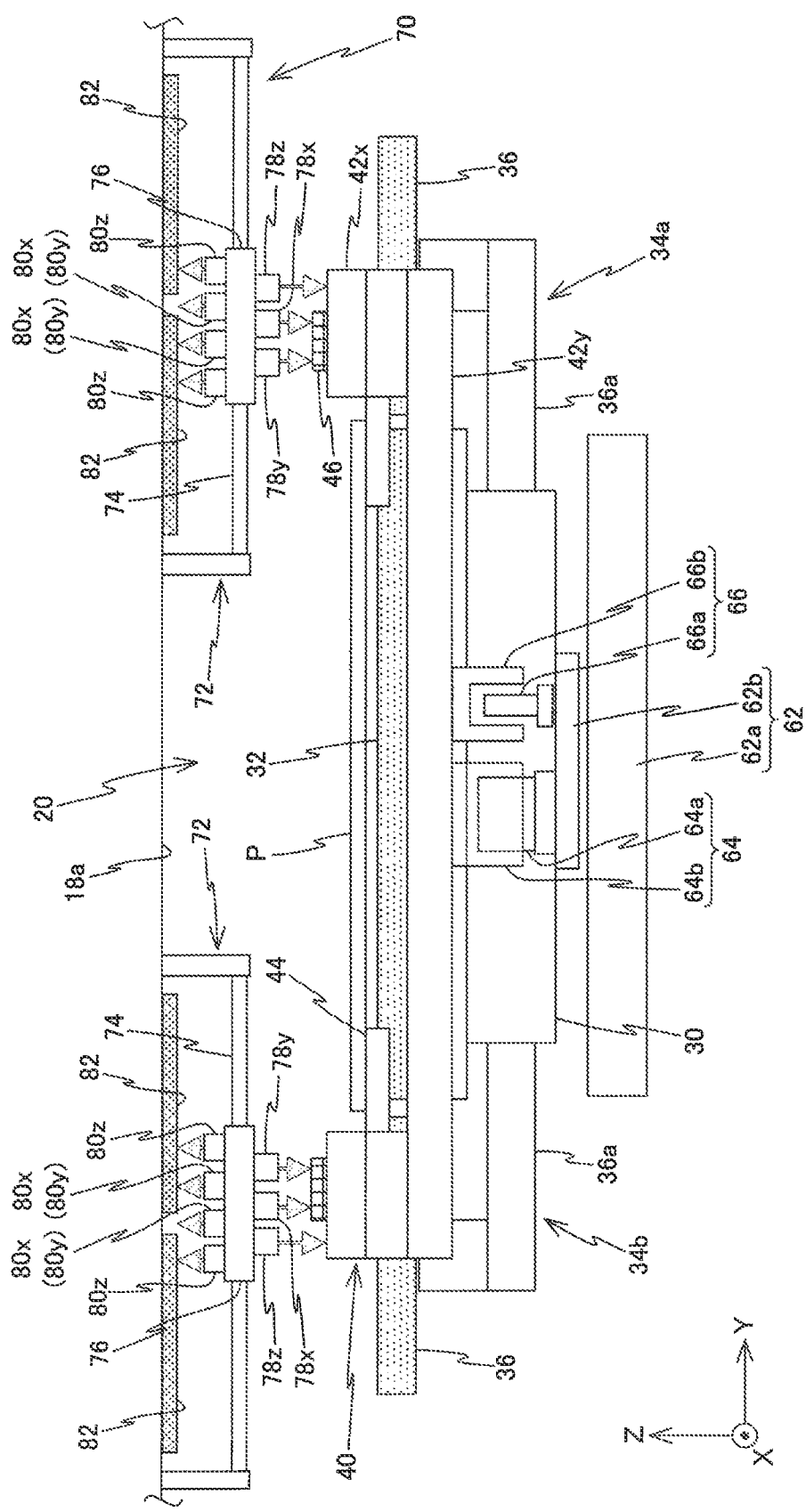
FIG. 4 is a required part enlarged view of the substrate stage device.

As illustrated in FIG. 2, substrate carrier drive system 60 is equipped with a pair of Y linear actuators 62 that include Y stators 62a that coarse movement stage 24 described above has and Y movers 62b that work with Y stators 62a to generate thrust forces in the Y-axis direction. As illustrated in FIG. 4, a Y stator 64a and an X stator 66a are attached to Y mover 62b of each of the pair of Y linear actuators 62.

Y stator 64a works with a Y mover 64b attached to substrate carrier 40 (the lower surface of Y frame 42y), to configure a Y voice coil motor 64 that applies a thrust force in the Y-axis direction to substrate carrier 40. Further, X stator 66a works with an X mover 66b attached to substrate carrier 40 (the lower surface of Y frame 42y), to configure an X voice coil motor 66 that applies a thrust force in the X-axis direction to substrate carrier 40. In this manner, substrate stage device 20 has one each of Y voice coil motor 64 and X voice coil motor 66 on each of the +X side and the −X side of substrate carrier 40.

Here, on the +X side and the −X side of substrate carrier 40, Y voice coil motors 64 and X voice coil motors 66 are each disposed point-symmetric with respect to the gravity center position of substrate P. Consequently, when causing the thrust force in the X-axis direction to act on substrate carrier 40 using X voice coil motor 66 on the −X side of substrate carrier 40 and X voice coil motor 66 on the +X side of substrate carrier 40, the effect similar to that of causing the thrust force in parallel to the X-axis direction to act on the gravity center position of substrate P can be obtained, that is, the moment in the θz direction can be suppressed from acting on substrate carrier 40 (substrate P). Note that since the pair of Y voice coil motors 64 are disposed with the gravity center (line) of substrate P in the X-axis direction in between, the moment in the θz direction does not act on substrate carrier 40.

Substrate carrier 40 is finely driven relative to coarse movement stage 24 (i.e. noncontact holder 32) in the directions of three degrees of freedom within the horizontal plane, by main controller 50 (FIG. 6) via the pair of Y voice coil motors 64 and the pair of X voice coil motors 66 described above. Further, when coarse movement stage 24 (i.e. noncontact holder 32) is moved with a long stroke in the X-axis direction, main controller 50 applies the thrust force in the X-axis direction to substrate carrier 40 using the pair of X voice coil motors 66 described above so that noncontact holder 32 and substrate carrier 40 are integrally moved with a long stroke in the X-axis direction.

Further, main controller 50 (see FIG. 6) relatively moves substrate carrier 40 with a long stroke with respect to noncontact holder 32 in the Y-axis direction, using the pair of Y linear actuators 62 and the pair of Y voice coil motors 64 described above. More specifically, while moving Y movers 62b of the pair of Y linear actuators 62 in the Y-axis direction, main controller 50 causes the thrust force in the Y-axis direction to act on substrate carrier 40 using Y voice coil motors 64 including Y stators 64a attached to Y movers 62b. Accordingly, substrate carrier 40 is moved with a long stroke in the Y-axis direction, independently (separately) from noncontact holder 32.

In this manner, in substrate stage device 20 of the present embodiment, substrate carrier 40 that holds substrate P is moved with a long stroke integrally with noncontact holder 32 in the X-axis (scanning) direction, whereas substrate carrier 40 is moved with a long stroke independently from noncontact holder 32 in the Y-axis direction. Note that, although the Z-positions of adsorption pads 44 and the Z-position of noncontact holder 32 are partially overlap as can be seen from FIG. 2, there is no risk that adsorption pads 44 and noncontact holder 32 come into contact with each other because it is only the Y-axis direction in which substrate carrier 40 is relatively moved with a long stroke with respect to noncontact holder 32.

Further, in the case of driving substrate table 30 (i.e. noncontact holder 32) in the Z-tilt directions, substrate P whose flatness has been corrected along noncontact holder 32 changes in attitude together with noncontact holder 32 in the Z-tilt directions, and therefore substrate carrier 40 that adsorbs and holds substrate P changes in attitude together with substrate P in the Z-tilt directions. Note that the attitude of substrate carrier 40 may be prevented from changing, by to the elastic deformation of adsorption pads 44.

Referring back to FIG. 1, the pair of auxiliary tables 34 are devices that work with noncontact holder 32 to support the lower surface of substrate P held by substrate carrier 40, and substrate carrier 40 (X frames 42x), when substrate carrier 40 is relatively moved in the Y-axis direction separately from noncontact holder 32. As is described above, substrate carrier 40 is relatively moved with respect to noncontact holder 32 in a state of holding substrate P, and therefore, for example, when substrate carrier 40 is moved in the +Y direction from the state illustrated in FIG. 1, the +Y side end vicinity part of substrate P is no longer supported by noncontact holder 32. Therefore, in substrate stage device 20, in order to suppress the bending due to the self-weight of a portion, of substrate P, that is not supported by noncontact holder 32, substrate P is supported from below using one of the pair of auxiliary tables 34. The pair of auxiliary tables 34 have substantially the same structure, except that they are disposed laterally symmetric on the page surface.

As illustrated in FIG. 3, auxiliary table 34 has a plurality of air levitation units 36. Note that such a configuration is employed in the present embodiment that air levitation unit 36 is formed into a bar-like shape extending in the Y-axis direction, and the plurality of air levitation units 36 are disposed at a predetermined spacing in the X-axis direction. However, the shape, the number, the arrangement and the like of air levitation units 36 are not limited in particular, as far as the bending of substrate P due to the self-weight can be suppressed. As illustrated in FIG. 4, the plurality of air levitation units 36 are supported from below by arm-like support members 36a protruding from the side surfaces of substrate table 30. A minute gap is formed between the plurality of air levitation units 36 and noncontact holder 32.

The height positions of the upper surfaces of air levitation units 36 are set substantially the same as (or slightly lower than) the height position of the upper surface of noncontact holder 32. Air levitation units 36 support substrate P in a noncontact manner by blowing out gas (e.g. air) from the upper surface of air levitation units 36 to the lower surface of substrate P. Note that, although noncontact holder 32 described above performs the flatness correction of substrate P by causing the preload to act on substrate P, air levitation units 36 only have to suppress the bending of substrate P, and therefore air levitation units 36 should only supply the gas to the lower surface of substrate P and do not have to control in particular the height position of substrate P on air levitation units 36.

Next, a substrate position measurement system 70 (see FIG. 6) for measuring position information of substrate P (substrate carrier 40) in the directions of six degrees of freedom will be described. Substrate position measurement system 70 of the present embodiment has a pair of head units 72, as illustrated in FIG. 1. One head unit 72 is disposed on the −Y side of projection optical system 16, while the other head unit 72 is disposed on the +Y side of projection optical system 16.

Each of the pair of head units 72 obtains position information of substrate P within the horizontal plane (position information in X-axis direction and the Y-axis direction, and rotation amount information in the θz direction), using reflection-type diffraction gratings that substrate carrier 40 has. Corresponding to the pair of head units 72, a plurality (e.g. six in FIG. 3) of scale plates 46 are pasted on the upper surface of each of the pair of X frames 42x of substrate carrier 40, as illustrated in FIG. 3. Scale plate 46 is a member with a band-like shape in planar view extending in the X-axis direction. The length of scale plate 46 in the X-axis direction is shorter, compared to the length of X frame 42x in the X-axis direction, and the plurality of scale plates 46 are arrayed at a predetermined spacing (spaced apart from each other) in the X-axis direction.

Figure 5:
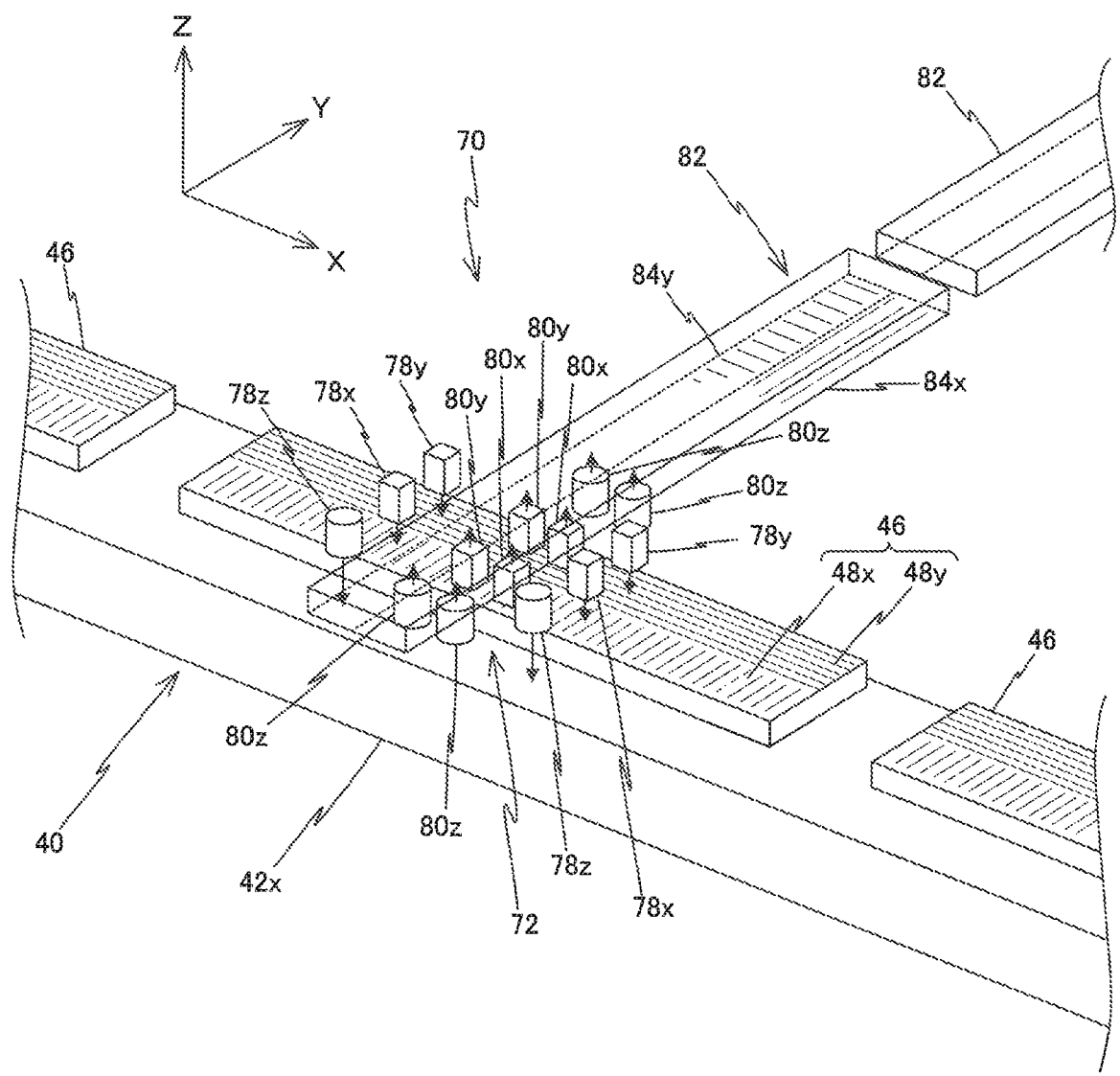
FIG. 5 is a concept view of a substrate position measurement system equipped in the liquid crystal exposure apparatus shown in FIG. 1.

FIG. 5 shows X frame 42x on the −Y side and head unit 72 corresponding thereto. On each of the plurality of scale plates 46 fixed on X frame 42x, an X scale 48x and a Y scale 48y are formed. X scale 48x is formed in the −Y side half area of scale plate 46, while Y scale 48y is formed in the +Y side half area of scale plate 46. X scale 48x has a reflection-type X diffraction grating, and Y scale 48y has a reflection-type Y diffraction grating. Note that in FIG. 5, in order to facilitate the understanding, a spacing (a pitch) between a plurality of grid lines that form X scale 48x and Y scale 48y is illustrated wider than the actual spacing (the actual pitch).

As illustrated in FIG. 4, head unit 72 is equipped with: a Y linear actuator 74; a Y slider 76 that is driven with a predetermined stroke relative to projection optical system 16 (see FIG. 1) in the Y-axis direction, by Y linear actuator 74; and a plurality of measurement heads (X encoder heads 78x and 80x, Y encoder heads 78y and 80y and Z sensor heads 78z and 80z) that are fixed to Y sider 76. The pair of head units 72 are similarly configured except that they are configured laterally symmetric on the page surface in FIGS. 1 and 4. Further, the plurality of scale plates 46 fixed on each of the pair of X frames 42x are also configured laterally symmetric in FIGS. 1 and 4.

Y linear actuator 74 is fixed to the lower surface of upper mount section 18a that apparatus main body 18 has. Y linear actuator 74 is equipped with a linear guide that straightly guides Y slider 76 in the Y-axis direction, and a drive system that applies a thrust force to Y slider 76. The type of the linear guide is not particularly limited, but an air bearing with a high repetitive reproducibility is suitable. Further, the type of the drive system is not particularly limited, and a linear motor, a belt (or wire) drive device or the like can be used.

Figure 6:
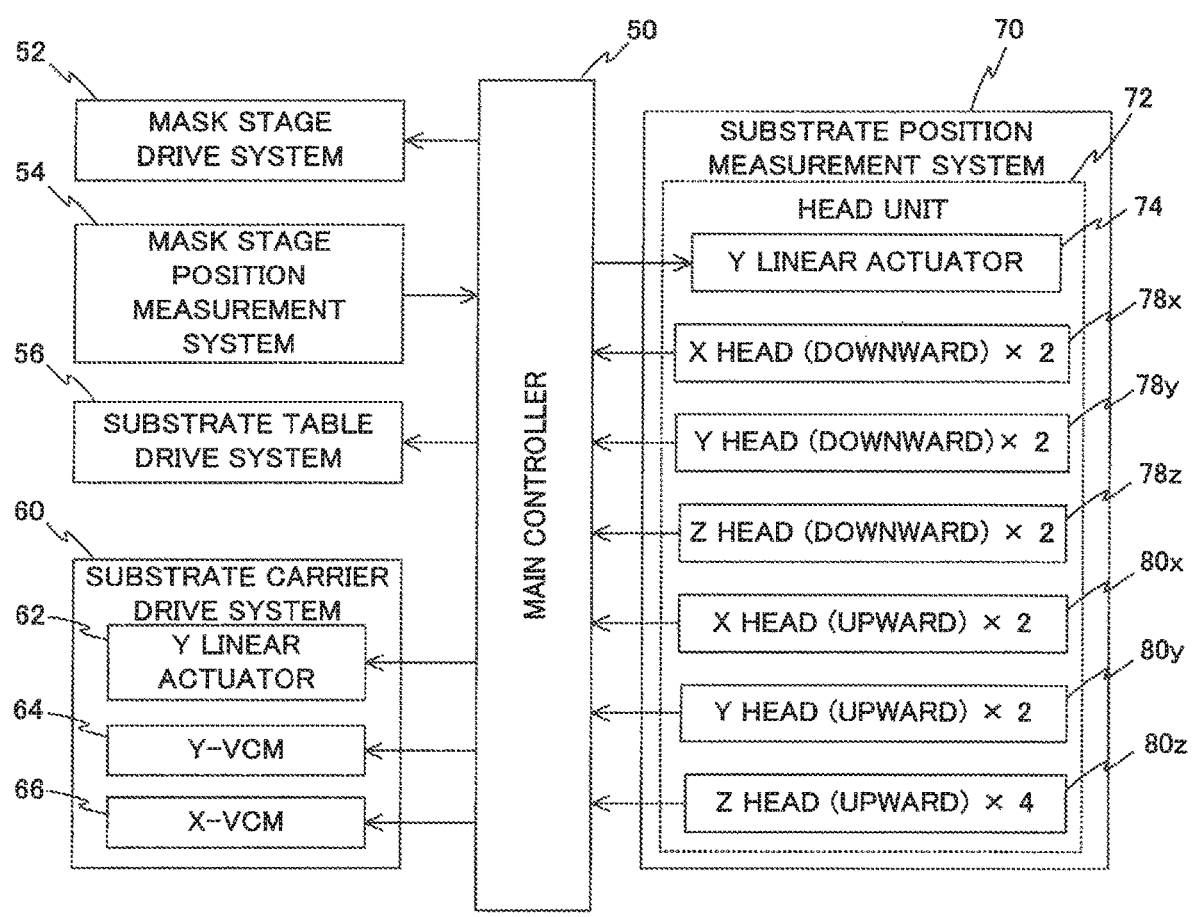
FIG. 6 is a block diagram showing the input/output relationship of a main controller that centrally configures a control system of the liquid crystal exposure apparatus.

Y linear actuator 74 is controlled by main controller 50 (see FIG. 6). The stroke amount of Y slider 76 in the Y-axis direction by Y linear actuator 74 is set equivalent to the stroke amount of substrate P (substrate carrier 40) in the Y-axis direction.

As illustrated in FIG. 5, head unit 72 is equipped with a pair of X encoder heads 78x (hereinafter, referred to as "X heads 78x"), a pair of Y encoder heads 78y (hereinafter, referred to as "Y heads 78y") and a pair of Z sensor heads 78z (hereinafter, referred to as "Z heads 78z"). The pair of X heads 78x, the pair of Y heads 78y and the pair of Z heads 78z are each disposed at a predetermined spacing in the X-axis direction.

X heads 78x and Y heads 78y are encoder heads of a so-called diffraction interference method as disclosed in, for example, U.S. Patent Application Publication No. 2008/0094592, and irradiate the respective corresponding scales (X scale 48x and Y scale 48y) with measurement beams downwardly (in the −Z direction), and receive beams (returned beams) from the respective scales, thereby supplying displacement amount information of substrate carrier 40 to main controller 50 (see FIG. 6).

That is, in substrate position measurement system 70 (see FIG. 6), for example, four X heads 78x in total that the pair of heads units 72 have and X scales 48x that face these X heads 78x configure, for example, four X linear encoder systems for obtaining position information of substrate carrier 40 in the X-axis direction. Similarly, for example, four Y heads 78y in total that the pair of heads units 72 have and Y scales 48y that face these Y heads 78y configure, for example, four Y linear encoder systems for obtaining position information of substrate carrier 40 in the Y-axis direction.

Here, the spacing between the pair of X heads 78x and the spacing between the pair of Y heads 78y in the X-axis direction that each of the pair of head units 72 has is set wider than the spacing between scale plates 46 adjacent to each other. Accordingly, in the X encoder systems and the Y encoder systems, at least one of the pair of X heads 78x constantly faces X scale 48x and also at least one of the pair of Y heads 78y constantly faces Y scale 48y, irrespective of the position of substrate carrier 40 in the X-axis direction.

Specifically, main controller 50 (FIG. 6) obtains X-position information of substrate carrier 40 on the basis of the average value of the outputs of the pair of X heads 78x in a state where the pair X heads 78x both face X scale 48x. Further, main controller 50 obtains the X-position information of substrate carrier 40 on the basis of only the output of one X head 78x of the pair of X heads 78x in a state where only the one X head 78x faces X scale 48x. Consequently, the X encoder systems can supply the position information of substrate carrier 40 to main controller 50 without interruption. The same can be said for the Y encoder systems.

Further, as the pair of Z sensor heads 78z for obtaining position information of substrate carrier 40 (i.e. substrate P. See FIG. 3) in the Z-tilt directions, for example, laser displacement meters are used. Here, the plurality of scale plates 46 fixed on X frame 42x corresponding to head unit 72 on the −Y side are disposed in a +Y side area on the upper surface of the X frame 42x (see FIG. 1). Accordingly, in a −Y side area on the upper surface of X frame 42x, a band-shaped area extending in the X-axis direction, where scale plates 46 are not attached, is formed.

Then, the band-shaped area described above on the upper surface of X frame 42x is made to be a reflection surface by, for example, mirror polishing. Each of the pair of Z heads 78z irradiates the reflection surface described above with a measurement beam (downwardly) and receives the reflected beam from the reflection surface, thereby obtaining displacement amount information in the Z-axis direction of substrate carrier 40 at the irradiation point of the measurement beam and supplying the displacement amount information to main controller 50 (see FIG. 6). Main controller 50 (see FIG. 6) obtains position information of substrate carrier 40 in the Z-tilt directions on the basis of the outputs of the pair of Z heads 78z that the pair of head units 72 each have, i.e., for example, a total of four Z-heads 78z. Note that the type of Z head 78z is not particularly limited, as far as Z head 78z can measure the displacement of substrate carrier 40 (for more detail, X frame 42x) in the Z-axis direction with apparatus main body 18 (see FIG. 1) serving as a reference, with a desired accuracy (resolution) and in a noncontact manner.

Here, since substrate carrier 40 of the present embodiment can be moved with a predetermined long stroke also in the Y-axis direction as is described above, main controller 50 (see FIG. 6) drives Y slider 76 (see FIG. 4) of each of the pair of head units 72 in the Y-axis direction, via Y linear actuator 74 (see FIG. 4), to follow substrate carrier 40 (see FIG. 7), depending on the position of substrate carrier 40 in the Y-axis direction, so that respective facing states between X heads 78x and Y heads 78y and scales 48x and 48y respectively corresponding thereto are maintained. Main controller 50 comprehensively obtains position information of substrate carrier 40 within the horizontal plane, by using together the displacement amount (the position information) of Y sliders 76 (i.e. each of heads 78x and 78y) and the output from each of heads 78x and 78y.

The position (displacement amount) information of Y sliders 76 (see FIG. 4) within the horizontal plane is obtained by encoder systems with the measurement accuracy equivalent to that of the encoder systems using X heads 78x and Y heads 78y described above. As can be seen from FIGS. 4 and 5, Y slider 76 has a pair of X encoder heads 80x (hereinafter, referred to as "X heads 80x") and a pair of Y encoder heads 80y (hereinafter, referred to as "Y heads 80y"). The pair of X heads 80x and the pair of Y heads 80y are each disposed at predetermined spacing in the Y-axis direction.

Main controller 50 (see FIG. 6) obtains position information of Y sliders 76 within the horizontal plane using a plurality of scale plates 82 fixed to the lower surface of upper mount section 18a of apparatus main body 18 (see FIG. 1 for each of them). Scale plate 82 is made up of a member with a band-like shape in planar view extending in the Y-axis direction. In the present embodiment, for example, two scale plates 82 are disposed at a predetermined spacing (spaced apart from each other) in the Y-axis direction, above each of the pair of head units 72.

As illustrated in FIG. 5, in a +X side area on the lower surface of scale plate 82, an X scale 84x is formed facing the pair of X heads 80x described above, and in a −X side area on the lower surface of scale plate 82, a Y scale 84y is formed facing the pair of Y heads 80y described above. X scale 84x and Y scale 84y are light-reflection-type diffraction gratings having configurations substantially similar to those of X scale 48x and Y scale 48y formed on scale plate 46 described above. Further, X head 80x and Y head 80y are encoder heads of a diffraction interference method having configurations similar to those of X head 78x and Y head 78y (the downward heads) described above.

The pair of X heads 80x and the pair of Y heads 80y irradiate the respective corresponding scales (X scale 84x and Y scale 84y) with measurement beams upwardly (in the +Z direction), and receive the beams from the respective scales, thereby supplying displacement amount information of Y slider 76 (see FIG. 4) within the horizontal plane to main controller 50 (see FIG. 6). The spacing in the Y-axis direction between the pair of X heads 80x and the spacing in the Y-axis direction between the pair of Y heads 80y are each set wider than the spacing between scale plates 82 adjacent to each other. Accordingly, at least one of the pair of X heads 80x constantly faces X scale 84x and also at least one of the pair of Y heads 80y constantly faces Y scale 84y, irrespective of the position of Y slider 76 in the Y-axis direction. Consequently, the position information of Y slider 76 can be supplied to main controller 50 (see FIG. 6) without interruption.

Here, as illustrated in FIG. 4, in head unit 72, since Y slider 76 is configured to be straightly guided in the Y-axis direction by the linear guide device, there is a possibility that a plurality of measurement heads (X heads 78x and 80x, Y heads 78y and 80y, and Z heads 78z and 80z) fixed to Y slider 76 are inclined. Therefore, main controller 50 (see FIG. 6) obtains information on inclination (tilt) amount of Y slider (including information on displacement amount in the optical axis direction) using, for example, four Z sensor heads 80z (hereinafter, referred to as "Z heads 80z") that are attached to Y slider 76, and also corrects the output of each of the measurement heads (X heads 78x and 80x, Y heads 78y and 80y, and Z heads 78z) on the basis of the outputs of, for example, the four Z sensor heads 80z in order to cancel out the inclination of Y slider 76 (the shift of the optical axes of the measurement beams). Note that in the present embodiment, for example, the four Z sensor heads 80z (the upward heads) are disposed at four locations that do not lie on the same straight line, but this is not intended to be limiting, and may be disposed at three locations that do not lie on the same straight line.

In the present embodiment, as sensor heads 80z (the upward sensors), laser displacement meters similar to sensor heads 78z are used, as an example, and sensor heads 80z obtain information on the inclination amount of Y slider 76 using a target (not illustrated) (a reflection surface extending in the Y-axis direction) that is fixed to the lower surface of upper mount section 18a (see FIGS. 9 and 11) (i.e., with upper mount section 18a serving as a reference). Note that the type of sensor heads 80z is not particularly limited as far as the sensor heads can obtain the information on the inclination amount of Y slider 76 with a desired accuracy. Further, in the present embodiment, for example, two scale plates 82 are disposed spaced apart in the Y-axis direction, and therefore the target that is different from scale plates 82 is used. However, in the case of using one longer scale plate than scale plate 82 of the present embodiment, the grating surface of the longer scale plate may be used as the target (the reflection surface).

In FIG. 6, a block diagram is illustrated that shows the input/output relationship of main controller 50 that centrally configures the control system of liquid crystal exposure apparatus 10 (see FIG. 1) and performs the overall control of the respective constituents. Main controller 50 includes a workstation (or a microcomputer) and the like, and performs the overall control of the respective constituents of liquid crystal exposure apparatus 10.

In liquid crystal exposure apparatus 10 (see FIG. 1) configured as described above, under the control of main controller 50 (see FIG. 6), mask M is loaded onto mask stage 14 by a mask loader (not illustrated) and also substrate P is loaded onto substrate stage device 20 (substrate carrier 40 and noncontact holder 32) by a substrate loader (not illustrated). After that, main controller 50 implements alignment measurement using an alignment detection system (not illustrated), and focus mapping using an autofocus sensor (not illustrated) (a surface position measurement system of substrate P), and after the alignment measurement and the focus mapping are finished, the exposure operations of a step-and-scan method are sequentially performed with respect to a plurality of shot areas set on substrate P. Note that, although the description has been made that the focus mapping for determining the Z-direction position of substrate P is performed beforehand in liquid crystal exposure apparatus 10, it is also possible that the focus mapping is not performed beforehand but is performed at any time immediately before scanning exposure is performed, while performing scanning exposure operations.

Next, an example of operations of substrate stage device 20 at the time of exposure operations will be described using FIGS. 8a to 10b. Note that although in the description below, the case when four shot areas are set on one substrate P (the so-called case of preparing four areas) will be described, the number and the arrangement of the shot areas set on one substrate P can be changed as needed. Further, in the present embodiment, as an example, the description will be made assuming that the exposure processing is performed from a first shot area S1 set on the −Y side and on the +X side of substrate P. Further, in order to avoid the intricacy of the drawings, a part of elements that substrate stage device 20 has is omitted in FIGS. 8a to 10b.

Figure 8A:
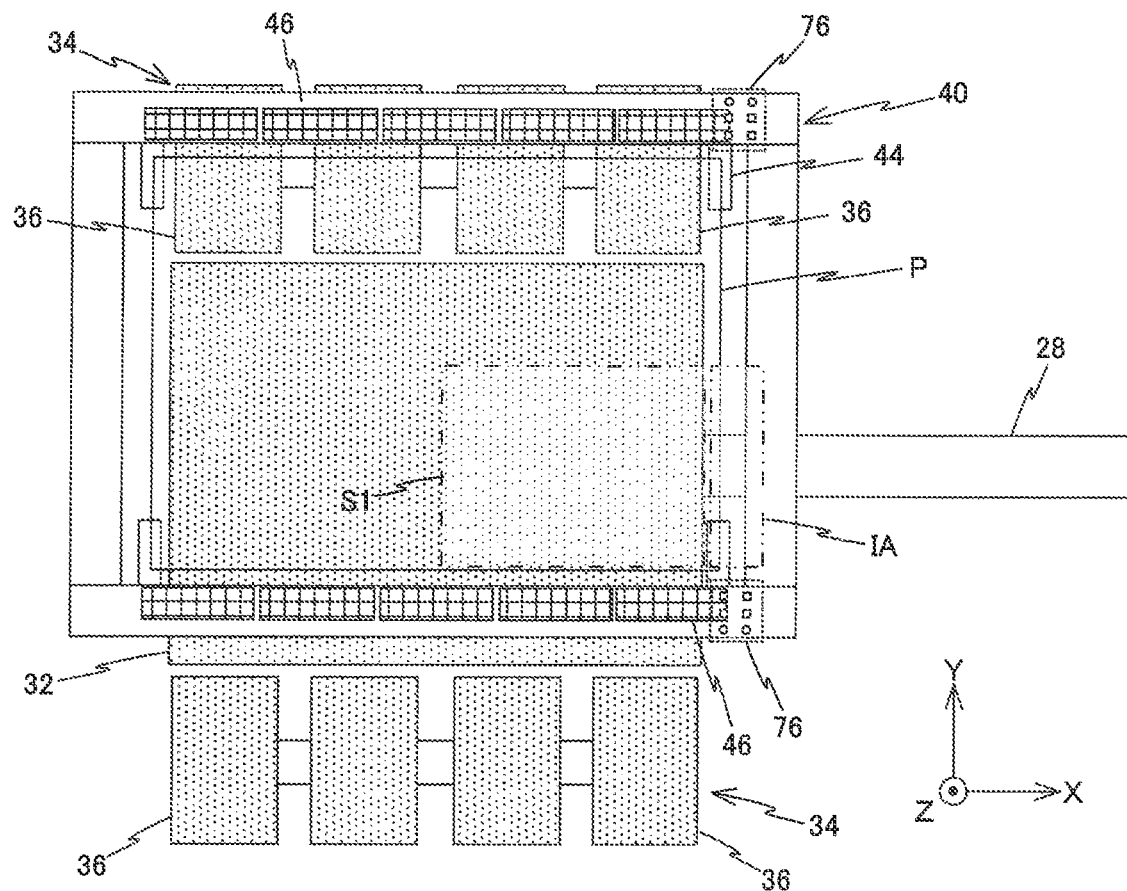
FIGS. 8a and 8b are views (a plan view and a front view, respectively) to explain an operation (No. 1) of the substrate stage device at the time of exposure operations.
Figure 8B:
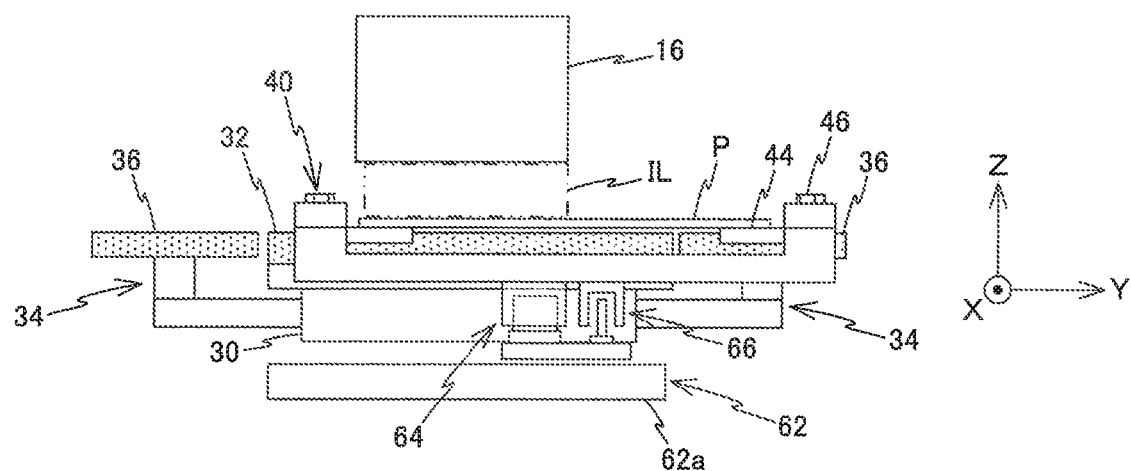

FIGS. 8a and 8b show a plan view and a front view, respectively, of substrate stage device 20 in a state where operations such as an alignment operation have been completed and preparation of the exposure operation with respect to the first shot area S1 is finished. In substrate stage device 20, as illustrated in FIG. 8a, the positioning of substrate P is performed on the basis of the output of substrate position measurement system 70 (see FIG. 6) so that the +X side end of the first shot area S1 is slightly on the further −X side than exposure area IA formed on substrate P by illumination light IL from projection optical system 16 (see FIG. 8b for each of them) being irradiated (however, in the state illustrated in FIG. 8a, illumination light IL has not yet been irradiated on substrate P).

Further, since the center of exposure area IA and the center of X guide bar 28 (i.e. noncontact holder 32) substantially coincide with each other in the Y-axis direction, the +Y side end vicinity part of substrate P held by substrate carrier 40 protrudes from noncontact holder 32. The protruding portion of substrate P is supported from below by auxiliary table 34 disposed on the +Y side of noncontact holder 32. At this time, although the flatness correction by noncontact holder 32 is not performed with respect to the +Y side end vicinity part of substrate P, the exposure accuracy is not affected because the flatness corrected state is maintained for an area including the first shot area S1 serving as an exposure target.

Figure 9A:
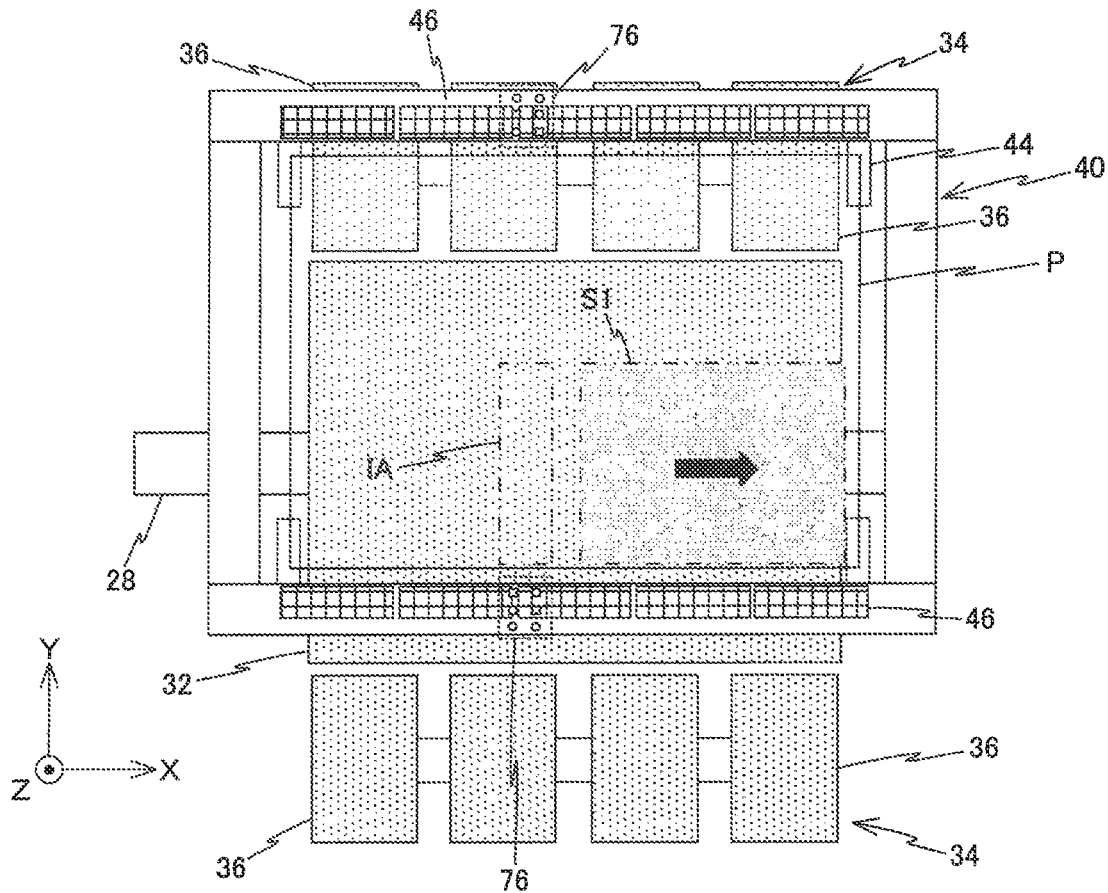
FIGS. 9a and 9b are views (a plan view and a front view, respectively) to explain an operation (No. 2) of the substrate stage device at the time of exposure operations.
Figure 9B:
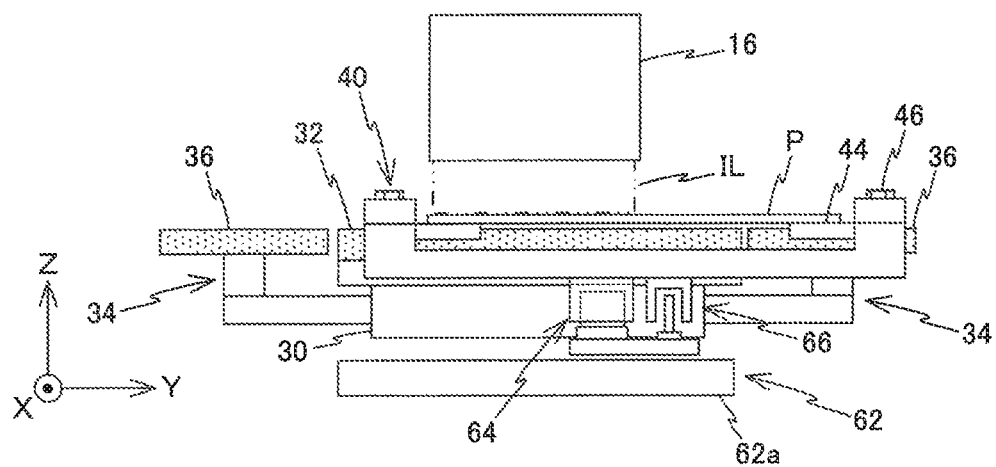

Subsequently, from the state illustrated in FIGS. 8a and 8b, substrate carrier 40 and noncontact holder 32 are integrally (synchronously) driven (accelerated, driven at the constant speed, and decelerated) in the +X direction on X guide bar 28 (see a black arrow in FIG. 9a), synchronously with mask M (see FIG. 1), on the basis of the output of substrate position measurement system 70 (see FIG. 6), as illustrated in FIGS. 9a and 9b. While substrate carrier 40 and noncontact holder 32 are driven at the constant speed in the X-axis direction, substrate P is irradiated with illumination light IL that has passed through mask M (see FIG. 1) and projection optical system 16 (see FIG. 9b for each of illumination light IL and projection optical system 16), and thereby a mask pattern that mask M has is transferred onto the shot area S1. At this time, substrate carrier 40 is finely driven as needed relative to noncontact holder 32 in the directions of three degrees of freedom within the horizontal plane, in accordance with the result of the alignment measurement described above, and noncontact holder 32 is finely driven as needed in the Z-tilt directions in accordance with the result of the focus mapping described above.

Here, in substrate position measurement system 70 (see FIG. 6), when substrate carrier 40 and noncontact holder 32 are driven in the X-axis direction (the +X direction in FIG. 9a), Y sliders 76 that the pair of head units 72 respectively have are in a static state.

Figure 10A:
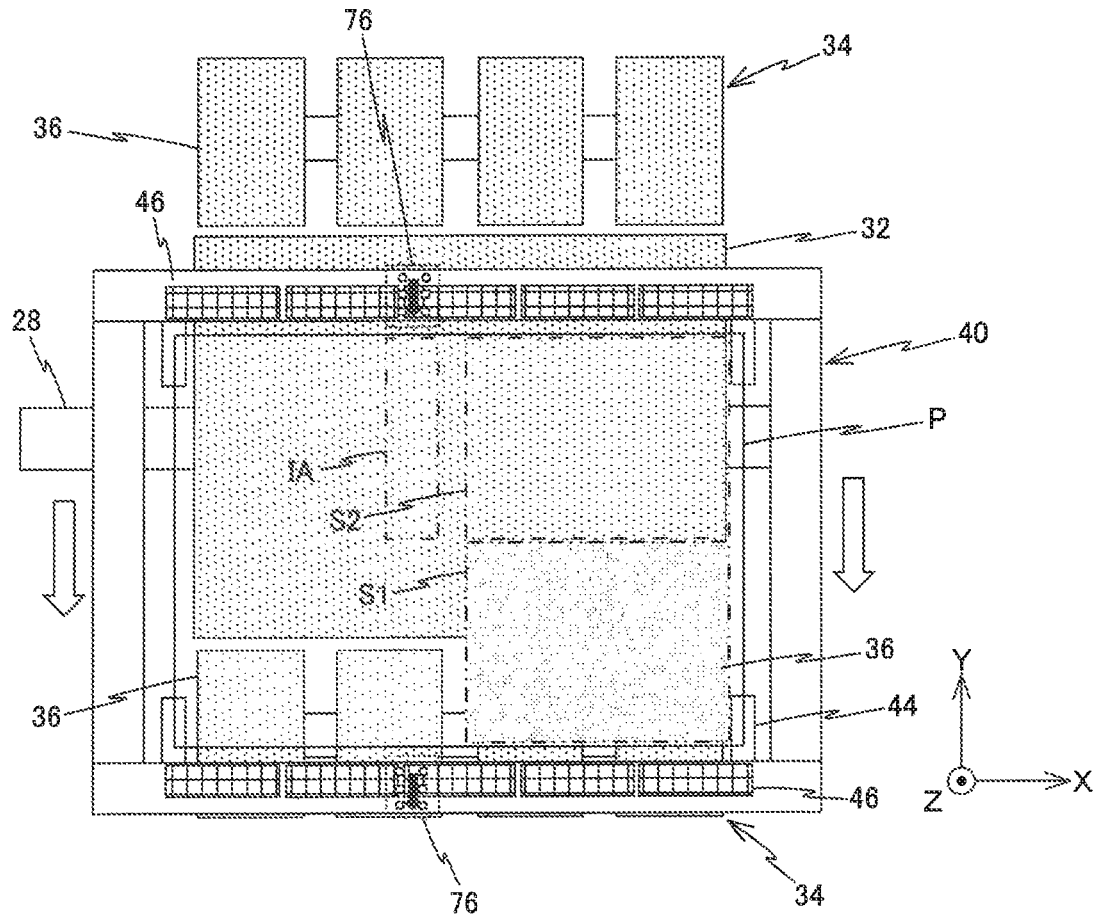
FIGS. 10a and 10b are views (a plan view and a front view, respectively) to explain an operation (No. 3) of the substrate stage device at the time of exposure operations.
Figure 10B:
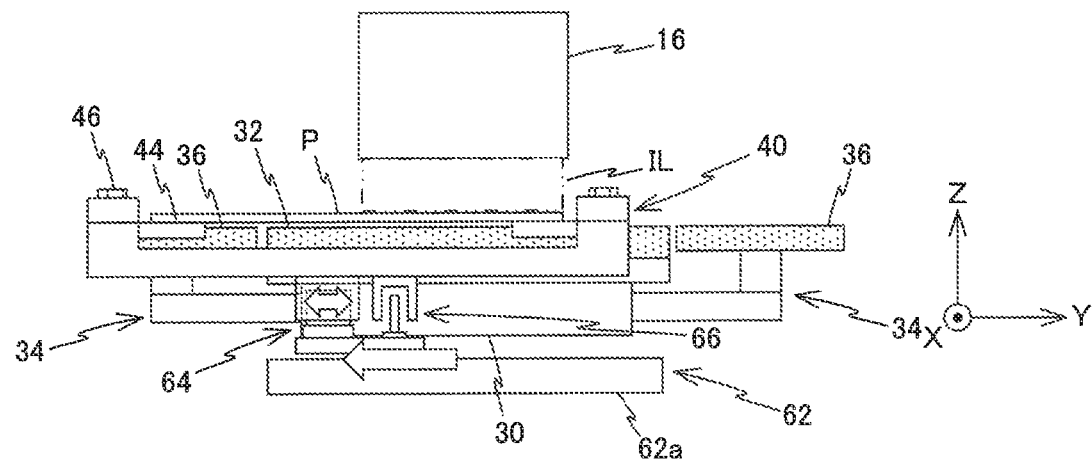

When the transfer of the mask pattern on the first shot area S1 on substrate P has been completed, in substrate stage device 20, as illustrated in FIGS. 10a and 10b, for the exposure operation with respect to a second shot area S2 set on the +Y side of the first shot area S1, substrate carrier 40 is driven (Y-step driven) by a predetermined distance in the −Y direction (a distance that is substantially a half of the width direction size of substrate P) (see outlined arrows in FIG. 10a), on the basis of the output of substrate position measurement system 70 (see FIG. 6). By the foregoing Y-step operation of substrate carrier 40, the −Y side end vicinity part of substrate P held by substrate carrier 40 is supported from below by auxiliary table 34 disposed on the −Y side of noncontact holder 32.

Figure 7:
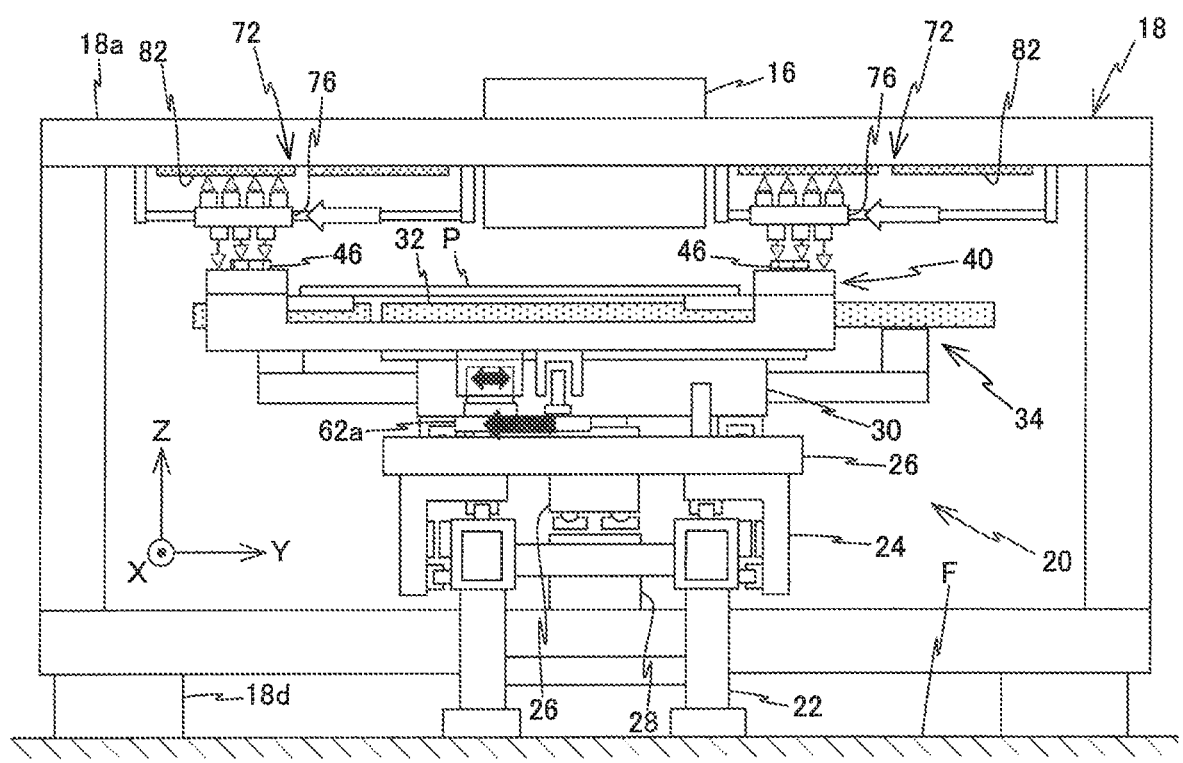
FIG. 7 is a view used to explain an operation (a step operation in a −Y direction) of the substrate stage device.

Further, when driving substrate carrier 40 described above in the −Y direction, main controller 50 (see FIG. 6) drives Y sliders 76 that the pair of head units 72 respectively have (see FIG. 4 for each of them) in the −Y direction (see black arrows in FIG. 10a) to be in synchronization with substrate carrier 40 in the Y-axis direction. That is, as illustrated in FIG. 7, in the case when substrate carrier 40 is moved with a predetermined stroke in the −Y direction, the pair of Y sliders 76 are moved synchronously with substrate carrier 40 in the −Y direction. In this case, in the present specification, "being moved synchronously" means that substrate carrier 40 and Y sliders 76 are moved in a state of substantially maintaining the relative positional relationship, and is not limited to the case when substrate carrier 40 and Y sliders 76 are moved in a state where their positions (the movement directions and the velocities) exactly coincide.

Then, although not illustrated, substrate carrier 40 and noncontact holder 32 are driven in the −X direction, synchronously with mask M (see FIG. 1), and thereby the scanning exposure with respect to the second shot area S2 is performed. Further, the Y-step operation of substrate carrier 40 and the constant speed movement of substrate carrier and noncontact holder 32 in the X-axis direction in synchronization with mask M are repeated as needed, and thereby the scanning exposure operations with respect to all the shot areas set on substrate P are sequentially performed.

According to substrate stage device 20 described so far that liquid crystal exposure apparatus 10 related to the present first embodiment has, since substrate position measurement system 70 for obtaining position information of substrate P within the XY plane includes the encoder systems, the influence by air fluctuation can be reduced, compared with, for example, conventional interferometer systems. Consequently, the positioning accuracy of substrate P is improved. Further, since the influence by air fluctuation is small, a partial air-conditioning facility that is essential in the case of using the conventional interferometer systems can be omitted, which allows the cost to be reduced.

Moreover, in the case of using interferometer systems, a large and heavy bar mirror is required to be equipped in substrate stage device 20. However, since such a bar mirror is unnecessary in the encoder systems related to the present embodiment, a system including substrate carrier 40 is downsized and lightened and also the better weight balance is obtained, and accordingly the position controllability of substrate P is improved. Further, the points to be adjusted can be decreased, compared with the case of using the interferometer systems, which leads to the cost reduction of substrate stage device 20 and further leads to the improved maintainability. Furthermore, the adjustment at the time of assembly is also facilitated.

Further, in substrate position measurement system 70 (the encoder systems) related to the present embodiment, since such a configuration is employed that the Y-position information of substrate P is obtained by driving the respective Y sliders 76 of the pair of head units 72 synchronously with substrate P (causing Y sliders to follow substrate P) in the Y-axis direction, a scale extending in the Y-axis direction needs not be disposed on the substrate stage device 20 side (or a plurality of heads need not be arrayed in the Y-axis direction on the apparatus main body side). Consequently, the configuration of substrate position measurement system 70 can be simplified, which allows the cost to be reduced.

Further, in substrate position measurement system 70 (the encoder systems) related to the present embodiment, since such a configuration is employed that the position information of substrate carrier 40 within the XY plane is obtained while switching the outputs of the pair of encoder heads (X heads 78x and Y heads 78y) adjacent to each other depending on the X-positon of substrate carrier 40, the position information of substrate carrier 40 can be obtained without interruption even if the plurality of scale plates 46 are disposed at a predetermined spacing (spaced apart from each other) in the X-axis direction. Consequently, a scale plate with a length equivalent to the stroke amount of substrate carrier 40 needs not be prepared, which allows the cost to be reduced and is especially suitable for liquid crystal exposure apparatus 10 using substrate P with a large size as in the present embodiment.

Further, in substrate stage device 20, when the high accuracy positioning of substrate P within the XY plane is performed, substrate carrier 40 with a frame-like shape that holds only the outer periphery edge of substrate P is driven in the directions of three degrees of freedom within the horizontal plane. Therefore, an object to be driven (substrate carrier 40 in the present embodiment) is lightweight, compared with, for example, the case of performing the high accuracy positioning of substrate P by driving a substrate holder that adsorbs and holds the entire lower surface of substrate P in the directions of three degrees of freedom within the horizontal plane, and thus the position controllability is improved. Further, the actuators for driving (Y voice coil motors 64 and X voice coil motors 66 in the present embodiment) can be downsized.

Second Embodiment

Next, a second embodiment will be described using FIG. 11. A liquid crystal exposure apparatus related to the present second embodiment obtains position information of substrate P within the horizontal plane using encoder systems, similarly to the first embodiment described above, but the second embodiment is different from the first embodiment described above in that head units for the encoder systems (a horizontal-in-plane position measurement system) and head units for Z-tilt position measurement system are independent from each other. Hereinafter, the differences from the first embodiment described above will be described, and elements that have the same configurations and functions as those in the first embodiment described above will be provided with the same reference signs as those in the first embodiment described above, and the description thereof will be omitted.

Figure 11:
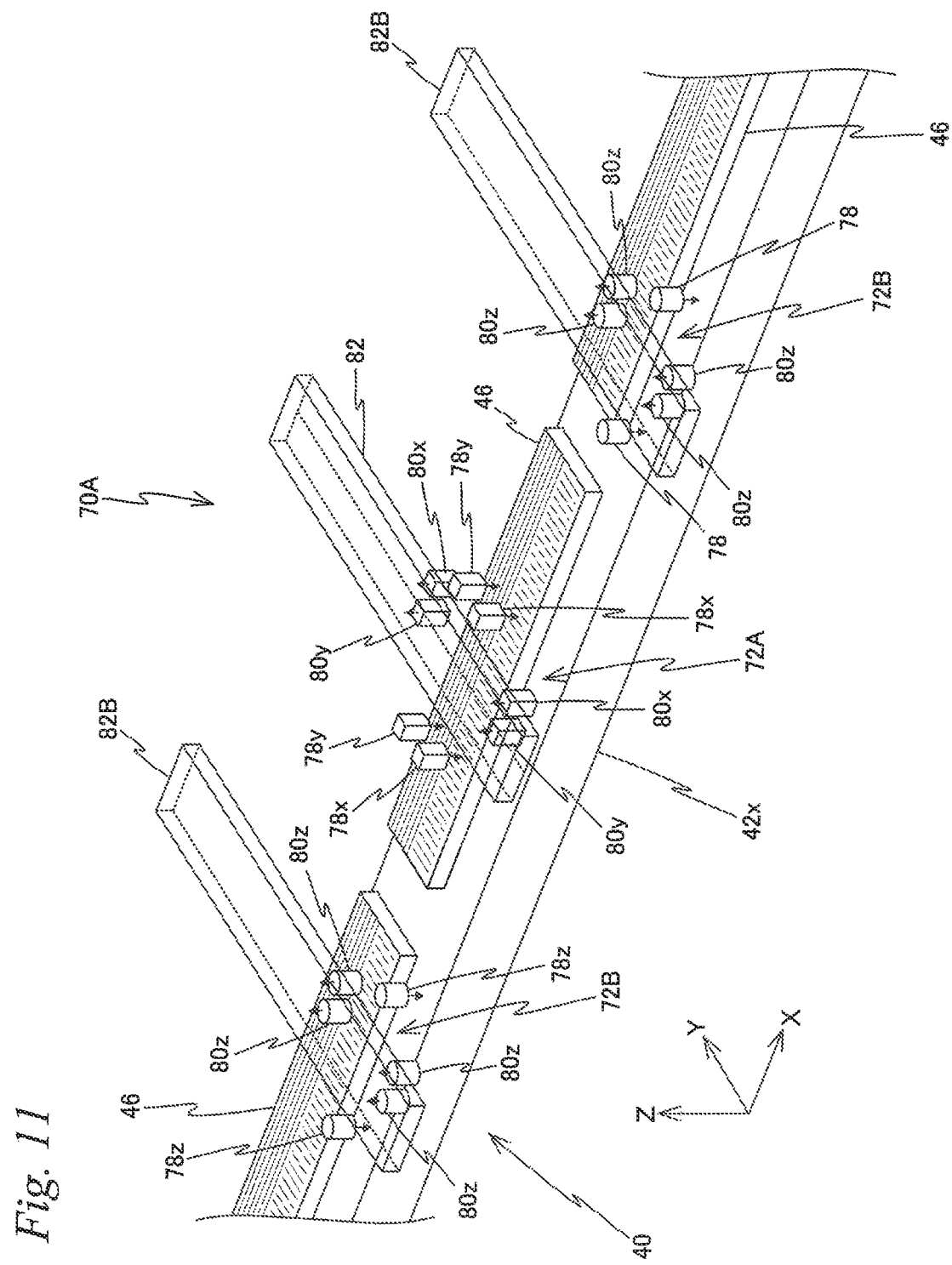
FIG. 11 is a concept view of a substrate position measurement system related to a second embodiment.

A substrate position measurement system 70A related to the present second embodiment has one head unit 72A and two head units 72B on each of one side and the other side of projection optical system 16 (see FIG. 1) in the Y-axis direction (only the one side is illustrated in FIG. 11). The position in the X-axis direction of head unit 72A substantially coincides with that of projection optical system 16. The two head units 72B are disposed on one side and the other side of head unit 72A in the X-axis direction.

Head unit 72A is a head unit that is configured by removing Z heads 78z and 80z from head unit 72 (see FIG. 5) related to the first embodiment described above. That is, head unit 72A obtains position information of substrate carrier 40 within the XY plane, by a pair of X heads 78x and a pair of Y heads 78y, using a plurality of scale plates 46 attached to substrate carrier 40. The points that the pair of X heads 78x and the pair of Y heads 78y are moved synchronously with substrate carrier 40 in the Y-axis direction, and the position information of the pair of X heads 78x and the pair of Y heads 78y is obtained by the pair of X heads 80x and the pair of Y heads 80y by using scale plates 82 are the same as the first embodiment described above, and therefore the description thereof will be omitted.

Head unit 72B is a head unit that is configured by removing X heads 78x and 80x and Y heads 78y and 80y from head unit 72 (see FIG. 5) related to the first embodiment described above. That is, head unit 72B obtains position information of substrate carrier 40 in the Z-tilt directions by the pair of Z heads 78z using the upper surface (the reflection surface) of X frame 42x of substrate carrier 40. The points that the pair of Z heads 78z are moved synchronously with substrate carrier 40 in the Y-axis direction, and that the attitude change of substrate carrier 40 is obtained by, for example, four Z heads 80z, using a target 82B fixed to apparatus main body 18 (see FIG. 1) are the same as the first embodiment described above, and therefore the description thereof will be omitted.

According to the present second embodiment, since head unit 72A of a position measurement system for substrate P within the horizontal plane and head units 72B of a position measurement system for substrate P in the Z-tilt directions are independent from each other, the configurations of the head units are simpler and the arrangement of each of the measurement heads is easier, compared to the first embodiment described above.

Third Embodiment

Next, a third embodiment will be described using FIGS. 12a and 12b. In the configuration of a liquid crystal exposure apparatus related to the present third embodiment, the configuration of a substrate stage device 120 for performing the high accuracy positioning of substrate P with respect to projection optical system 16 (see FIG. 1) is different from that in the first embodiment described above. The configuration of a measurement system for obtaining position information of substrate P in the directions of six degrees of freedom is the same as the first embodiment described above. Hereinafter, in the present third embodiment, only the differences from the first embodiment described above will be described, and elements that have the same configurations and functions as those in the first embodiment described above will be provided with the same reference signs as those in the first embodiment described above, and the description thereof will be omitted.

Figure 12A:
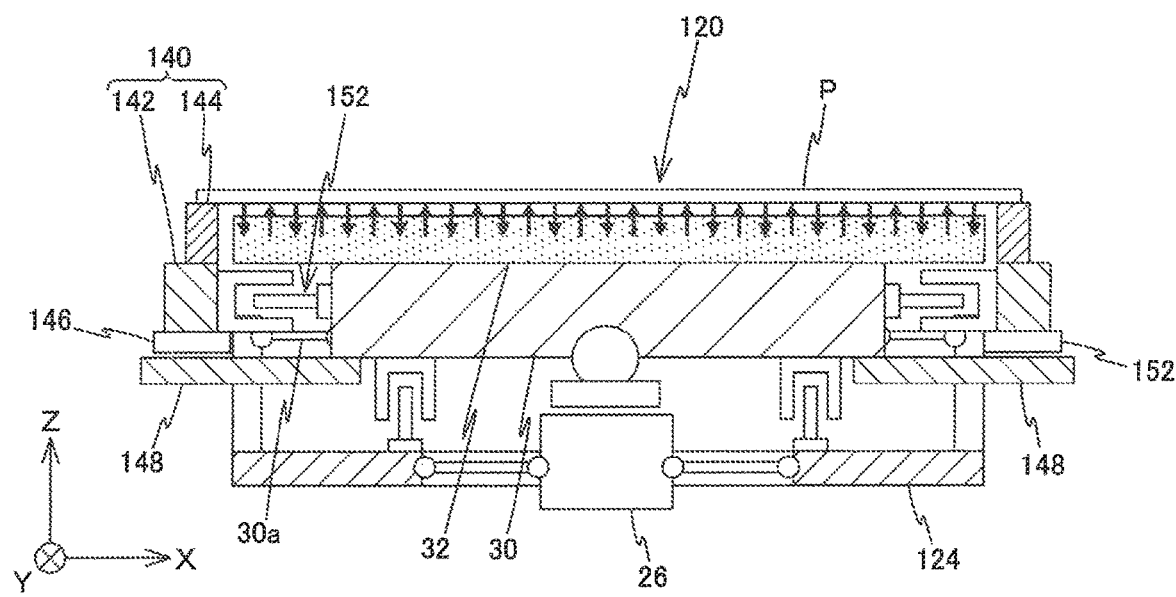
FIGS. 12a and 12b are views (a cross-sectional view and a plan view, respectively) showing a substrate stage device related to a third embodiment.
Figure 12B:
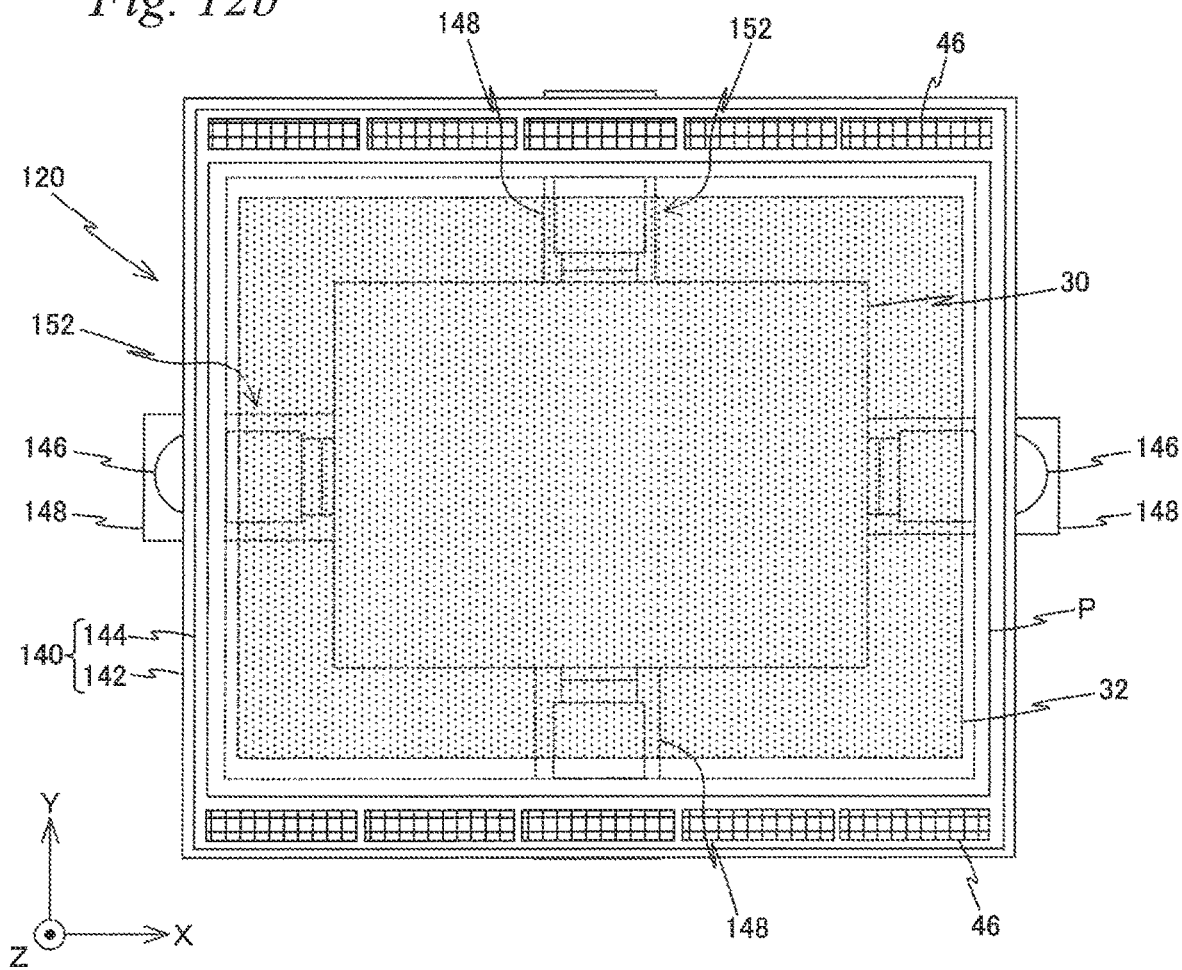

Substrate carrier 40 with a frame-like shape (a picture-frame-like shape) that holds substrate P is relatively movable with a predetermined stroke independently from noncontact holder 32 in the non-scanning direction (the Y-axis direction) in the first embodiment described above (see the drawings such as FIG. 1), whereas in substrate stage device 120 in the present third embodiment as illustrated in FIGS. 12a and 12b, a substrate carrier 140 is moved with a predetermined stroke integrally with noncontact holder 32 in each of the scanning direction (the X-axis direction) and the non-scanning direction, which is different from the first embodiment described above. The point that substrate carrier 140 is relatively movable with a fine stroke with respect to noncontact holder 32 in the directions of three degrees of freedom within the horizontal plane is similar to substrate stage device 20 of the first embodiment described above.

More specifically, in the present third embodiment, a coarse movement stage 124 is configured movable with a predetermined long stroke in the X-axis direction and the Y-axis direction. Although the configuration for moving coarse movement stage 124 with a long stroke in the Y-axis direction is not particularly limited, a gantry type XY stage device known to public that is disclosed in, for example, U.S. Patent Application Publication No. 2012/0057140 and the like can be used. Further, weight cancelling device 26 is coupled to coarse movement stage 124 to be moved with a predetermined long stroke integrally with coarse movement stage 124 in the X-axis direction and the Y-axis direction. Further, X guide bar 28 (see the drawings such as FIG. 1) is also movable with a predetermined long stroke in the Y-axis direction. Although a configuration for moving X guide bar 28 with a long stroke in the Y-axis direction is not particularly limited, such a configuration should be mechanically coupled to, for example, a Y stage of the XY stage device described above. The point that coarse movement stage 124 and substrate table 30 are mechanically coupled (however, in a state of being finely movable in the Z-tilt directions) via a plurality of coupling devices 30b (flexure devices) is the same as the first embodiment described above. Accordingly, substrate table 30 and noncontact holder 32 are moved with a predetermined long stroke integrally with coarse movement stage 124 in the X-axis direction and the Y-axis direction.

Substrate carrier 140 has a main body section 142 formed into a rectangular frame-like shape in planar view, and an adsorption section 144 fixed to the upper surface of main body section 142. Adsorption section 144 is also formed into a rectangular frame-like shape in planar view, similarly to main body section 142. Substrate P is held by, for example, vacuum adsorption by adsorption section 144. Noncontact holder 32 described above is inserted into an opening that adsorption section 144 has, in a state where a predetermined gap is formed between noncontact holder 32 and the inner wall surface of adsorption section 144. The point that noncontact holder 32 causes the load (the preload) to act on substrate P, thereby performing flatness correction in a noncontact manner is the same as the first embodiment described above.

Further, from the lower surface of substrate table 30, a plurality (e.g. four in the present embodiment) of guide plates 148 radially extend along the horizontal plane. Substrate carrier 140 has a plurality of pads 146 including air bearings, corresponding to the plurality of guide plates 148, and substrate carrier 140 is placed in a noncontact state on guide plates 148 by a static pressure of the pressurized gas blown out from the air bearings to the upper surfaces of guide plates 148. In the case when substrate table 30 is finely driven in the Z-tilt directions, the plurality of guide plates 148 are also moved in the Z-tilt directions (the attitude is changed) integrally with substrate table 30, and therefore, when the attitude of substrate table 30 is changed, the attitudes of substrate table 30, noncontact holder 32 and substrate carrier 140 (i.e. substrate P) are integrally changed.

Further, substrate carrier 140 is finely driven with respect to substrate table 30 in the directions of three degrees of freedom within the horizontal plane via a plurality of linear motors 152 (X voice coil motors and Y voice coil motors) including movers that substrate carrier 140 has and stators that substrate table 30 has. Further, when substrate table 30 is moved with a long stroke along the XY plane, the thrust forces is applied to substrate carrier 140 by the plurality of linear motors 152 described above, so that substrate table 30 and substrate carrier 140 are integrally moved with a long stroke along the XY plane.

A plurality of scale plates 46 are fixed to each of the +Y side end vicinity part and the −Y side end vicinity part of the upper surface of substrate carrier 140, similarly to the first embodiment described above. Since the way to obtain position information of substrate carrier 140 (i.e. substrate P) in the directions of six degrees of freedom using scale plates 46 and the upper surface (the reflection surface) of substrate carrier 140 is the same as that of the first embodiment described above, the description thereof will be omitted.

Note that the configurations described in each of the first to third embodiments described above can be changed as needed. For example, in each of the embodiments described above, although a plurality of scale plates 46 are arrayed at a predetermined spacing in the X-axis direction on substrate carrier 40 or 140, a long scale plate whose length in the X-axis direction is about the same as the length of substrate P may be used. In this case, each of the pair of head units 72 only has to be provided with one each of X head 78$x$ and Y head 78$y$. In the case when a plurality of scale plates 46 are provided, the respective lengths of the plurality of scale plates 46 may be different from each other. For example, the length of a scale plate extending in the X-axis direction is set longer than the length of a shot area in the X-axis direction, and thereby the position control of substrate P by head unit 72 that is located across the different scale plates 46 can be avoided at the time of scanning exposure operations. Further (for example, in the case of preparing four areas and the case of preparing six areas), a scale disposed on one side of projection optical system 16 and a scale disposed on the other side may have the respective lengths different from each other. Further, in the case when a plurality of scale groups (scale rows), in each of which a plurality of scale plates disposed in the Y-axis direction are arranged in line via a gap of a predetermined spacing, are disposed at different positions spaced from each other in the X-axis direction (e.g., the position on one side (the +X side) and the position on the other side (the −X side) with respect to projection optical system 16), the positions of the gaps of the predetermined spacing described above may be disposed not to overlap in the Y-axis direction among the plurality of scale rows. By disposing the plurality of scale rows in this manner, the heads placed corresponding to the respective scale rows can be prevented from being simultaneously located outside the measurement range (in other words, both the heads can be prevented from simultaneously facing the gaps).

Further, in scale groups (scale rows) on substrate carrier 40, in each of which a plurality of scales are arranged in line via a gap of a predetermined spacing in the X-axis direction, the scales with the same length are arranged in line in the embodiments described above, but the scales with lengths different from each other may be arranged in line. For example, in a scale row on substrate carrier 40, the length in the X-axis direction of scales disposed in the central part may be set physically longer than the length in the X-axis direction of scales disposed near both ends in the X-axis direction (scales disposed at the respective ends in a scale row).

Further, in scale groups (scale rows) on substrate carrier 40, in each of which a plurality of scales are arranged in line via a gap of a predetermined spacing in the X-axis direction, the length of one scale (a pattern for X-axis measurement) in the X-axis direction may be set to a length with which the measurement corresponding to only the length of one shot area can be continuously performed (a length along which a device pattern is irradiated and formed on a substrate when scanning exposure is performed while moving the substrate on a substrate holder in the X-axis direction). By setting the length of one scale in the X-axis direction in this manner, the transfer control of heads with respect to a plurality of scales do not have to be performed during the scanning exposure of one shot area, and therefore the position measurement (the position control) of substrate P (the substrate holder) during the scanning exposure can be performed easily.

Further, although the position information of each of substrate P and Y sliders 76 within the XY plane is obtained by X encoder heads 78$x$ and 80$x$ and Y encoder heads 78$y$ and 80$y$, Z-tilt displacement amount information of each of substrate P and Y sliders 76 may also be obtained together with the position information of each of substrate P and Y sliders 76 within the XY plane, by using, for example, a two-dimensional encoder head (an XZ encoder head or a YZ encoder head) that is capable of measuring displacement amount information in the Z-axis direction. In this case, sensor heads 78$z$ and 80$z$ for obtaining the Z-tilt position information of substrate P can be omitted. Note that, in this case, since two downward Z heads need to constantly face scale plate 46 in order to obtain the Z-tilt position information of substrate P, it is preferable that scale plate 46 is configured of one long scale plate with a length that is about the same as the length of X frame 42x, or for example, three or more of the two-dimensional encoder heads described above are disposed at a predetermined spacing in the X-axis direction.

Further, although in the encoder systems in the each of the embodiments described above, such a configuration is employed that substrate carrier 40 or 140 has scale plates 46 (diffraction gratings) and head units 72 have measurement heads, this is not intended to be limiting, and substrate carrier 40 or 140 may have measurement heads and scale plates that are moved synchronously with the measurement heads may be attached to apparatus main body 18 (the arrangement reversed to that in each of the embodiments described above may be employed).

Further, although in each of the embodiments described above, a plurality of scale plates 46 are disposed at a predetermined spacing in the X-axis direction, this is not intended to be limiting, and for example, one long scale plate formed with a length about the same as the length of substrate carrier 40 in the X-axis direction may be used. In this case, since the facing state between the scale plate and the heads is constantly maintained, each head unit 72 only has to have one each of X head 78x and Y head 78y. The same can be said for scale plate 82. Further, although in the first embodiment described above, scale plates 46 are attached to the substantially entire area of the upper surface of X frame 42x, the range in which scale plates 46 are attached can be changed as needed, depending on the movement range of substrate carrier 40 in the X-axis direction. That is, the attachment range of scale plates 46 may be shorter as far as it is possible for the plurality of heads to face scale plate 46 located closest to the +X side and scale plate 46 located closest to the −X side within the movement range of substrate carrier 40. Further, depending on the circumstances, a plurality of scale plates (or one long scale plate) may be provided in a range longer than the length of X frame 42x in the X-axis direction, and in this case, scale plate(s) 46 may be attached to another member longer than X frame 42x in the X-axis direction. Further, although in each of the embodiments described above, two-dimensional measurement is performed by combining one-dimensional encoder systems configured of one-dimensional scales and one-dimensional heads, this is not intended to be limiting, and a two-dimensional encoder system that is configured of two-dimensional scales (XY scales) and two-dimensional heads (XY heads) may be used.

Further, although in each of the embodiments described above, the position information of substrate carrier 40 or 140 and the position information of Y sliders 76 are each obtained by the encoder systems, this is not intended to be limiting, and position information of Y sliders 76 may be obtained by another measurement system such as, for example, an optical interferometer system.

Further, substrate stage device 20 of the first embodiment described above is configured so that noncontact holder 32 and substrate carrier 40 are integrally movable in the X-axis (scanning) direction and substrate carrier 40 is movable relative to noncontact holder 32 in the Y-axis (non-scanning) direction. However, inversely to this configuration, substrate stage device 20 may be configured so that noncontact holder 32 and substrate carrier 40 are integrally movable in the Y-axis direction and substrate carrier 40 is movable relative to noncontact holder 32 in the X-axis direction. In this case, since only substrate carrier 40 has to be moved with along stroke in the scanning direction at the time of scanning exposure operations and thus an object to be driven is lightweight, the position controllability is improved. Further, the actuators for driving can be downsized.

Further, although in each of the embodiments described above, substrate carrier 40 or the like is formed into a rectangular frame-like shape by, for example, four frame members along the outer periphery edges (four sides) of substrate P (in the first embodiment, a pair of X frames 42x and a pair of Y frames 42y), this is not intended to be limiting as far as the holding by adsorption of substrate P can be reliably performed. And, substrate carrier 40 or the like may be configured of frame members, for example, along a part of the outer periphery edges of substrate P. Specifically, the substrate carrier may be formed into a U-like shape in planar view by, for example, three frame members along three sides of substrate P, or may be formed into an L-like shape in planar view by, for example, two frame members along two adjacent sides of substrate P. Further, the substrate carrier may be formed by, for example, only one frame member along one side of substrate P. Further, the substrate carrier may be configured by a plurality of members which hold portions different from each other of substrate P and whose positions are controlled independently from each other.

Further, although in each of the embodiments described above, noncontact holder 32 supports substrate P in a noncontact manner, this is not intended to be limiting as far as the relative movement of substrate P and noncontact holder 32 in directions parallel to the horizontal plane is not blocked, and substrate P may be supported in a contact state via a rolling element such as, for example, a ball.

Further, a light source used in illumination system 12 and the wavelength of illumination light IL irradiated from the light source are not particularly limited, and for example, may be ultraviolet light such as an ArF excimer laser beam (with a wavelength of 193 nm) or a KrF excimer laser beam (with a wavelength of 248 nm), or vacuum ultraviolet light such as an $F_2$ laser beam (with a wavelength of 157 nm).

Further, although in each of the embodiments described above, an unmagnification system is used as projection optical system 16, the projection optical system is not limited thereto, and a reduction system or a magnifying system may be used.

Further, the use of the exposure apparatus is not limited to the exposure apparatus for liquid crystal display devices that transfers a liquid crystal display device pattern onto a square-shaped glass plate, but can be widely applied also to, for example, an exposure apparatus for manufacturing organic EL (Electro-Luminescence) panels, an exposure apparatus for manufacturing semiconductor devices, and an exposure apparatus for manufacturing thin-film magnetic heads, micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a mask or a reticle used in an exposure apparatus such as an optical exposure apparatus, an EUV exposure apparatus, an X-ray exposure apparatus, or an electron beam exposure apparatus.

Further, an object serving as an exposure target is not limited to a glass plate, but may be other objects such as, for example, a wafer, a ceramic substrate, a film member, or a mask blank. Further, in the case when an object to be exposed is a substrate for flat-panel display, the thickness of the substrate is not particularly limited, and for example, a film-like member (a sheet-like member with flexibility) is also included. Note that the exposure apparatus of the present embodiments is especially effective in the case when a substrate having a side or a diagonal line with a length of 500 mm or greater is an object to be exposed. Further, in the case when a substrate serving as an exposure target is like a sheet with flexibility, the sheet may be formed into a roll state.

Electronic devices such as liquid crystal display devices (or semiconductor devices) are manufactured through the steps such as: a step in which the function/performance design of a device is performed; a step in which a mask (or a reticle) based on the design step is manufactured; a step in which a glass substrate (or a wafer) is manufactured; a lithography step in which a pattern of the mask (the reticle) is transferred onto the glass substrate with the exposure apparatus in each of the embodiments described above and the exposure method thereof; a development step in which the glass substrate that has been exposed is developed; an etching step in which an exposed member of the other section than a section where resist remains is removed by etching; a resist removal step in which the resist that is no longer necessary when etching is completed is removed; a device assembly step; and an inspection step. In this case, in the lithography step, the exposure method described previously is implemented using the exposure apparatus in the embodiments described above and a device pattern is formed on the glass substrate, and therefore, the devices with a high integration degree can be manufactured with high productivity.

Incidentally, the disclosures of all the U.S. Patent Application Publications and the U.S. Patents related to exposure apparatuses and the like that are cited in the embodiments described above are each incorporated herein by reference.

INDUSTRIAL APPLICABILITY

As is described so far, the movable body apparatus and the movement method of objects of the present invention are suitable for moving objects. Further, the exposure apparatus of the present invention is suitable for exposing objects. Further, the manufacturing method of flat-panel displays of the present invention is suitable for manufacturing of flat-panel displays. Further, the device manufacturing method of the present invention is suitable for manufacturing of microdevices.

REFERENCE SIGNS LIST

10 . . . liquid crystal exposure apparatus,
20 . . . substrate stage device,
32 . . . noncontact holder,
40 . . . substrate carrier,
46 . . . scale plate,
70 . . . substrate position measurement system,
76 . . . Y slider,
78, 80$x$ . . . X encoder heads,
78$y$, 80$y$ . . . Y encoder heads,
82 . . . scale plate,
P . . . substrate.

The invention claimed is:

1. A movable body apparatus, comprising:
a support section that supports an object in a noncontact manner;
a holding section that holds the object supported in a noncontact manner by the support section;
a first drive section that moves the holding section in a first direction and a second direction intersecting each other;
a second drive section that moves the support section in the first direction;
a reference member serving as a reference of movement of the holding section in the first and the second directions;
a first measurement section having a first grating section that has a measurement component in the first direction and a first head that is disposed to face the first grating section and irradiates the first grating section with a measurement beam, the first measurement section measuring first position information of the first head by the first head and the first grating member, one of the first grating section and the first head being provided at the holding section;
a movable body provided with the other of the first grating section and the first head;
a third drive section that moves the movable body in the second direction;
a second measurement section that measures second position information of the movable body provided with the other of the first grating section and the first head, with respect to the reference member; and
a position measurement system that obtains third position information, in the first and the second directions, of the holding section that holds the object with respect to the reference member, based on the first position information measured by the first measurement section and the second position information measured by the second measurement section,
wherein the first and the second drive sections relatively moves the support section that supports the object in a noncontact manner and the holding section that holds the object, with respect to the movable body in the first direction, based on the third position information, and
the third drive section moves the movable body in the second direction so that a facing arrangement of the first grating section and the first head is maintained during relative movement of the holding section with respect to the support section in the second direction by the first drive section.

2. The movable body apparatus according to claim 1, wherein the second measurement section has a second grating section that has a measurement component in the second direction and a second head that irradiates the second grating section with a measurement beam, one of the second grating section and the second head being provided at the movable body and the other of the second grating section and the second head being provided at the reference member.

3. The movable body apparatus according to claim 1, wherein the first measurement section measures position information of the holding section with respect to the movable body in a third direction intersecting the first and the second directions.

4. The movable body apparatus according to claim 1, wherein the holding section includes a frame-shaped member that holds at least a part of an outer periphery edge of the object.

5. An exposure apparatus, comprising:
the movable body apparatus according to claim 1; and
a pattern forming device that forms a predetermined pattern on the object using an energy beam.

6. The exposure apparatus according to claim 5, wherein the support section has a support surface that is capable of supporting substantially an entire area of a target, on which the pattern is formed, of the object.

7. The exposure apparatus according to claim 6, wherein the first drive section relatively moves the holding section and the support section so that at least a part of the object moves off from the support section in the second direction.

8. The exposure apparatus according to claim 5, wherein the object is a substrate used in a flat-panel display.

9. The exposure apparatus according to claim 8, wherein the substrate has at least a side or a diagonal line with a length of 500 mm or greater.

10. A manufacturing method of a flat-panel display, comprising:
exposing the object using the exposure apparatus according to claim 5; and
developing the object that has been exposed.

11. A device manufacturing method, comprising:
exposing the object using the exposure apparatus according to claim 5; and
developing the object that has been exposed.

12. A movement method of an object, comprising:
supporting an object in a noncontact manner, by a support section;
holding the object supported in a noncontact manner by the support section, by a holding section;
moving the holding section in a first direction and a second direction intersecting each other;
by a first measurement section having a first grating section that has a measurement component in the first direction and a first head that is disposed to face the first grating section and irradiates the first grating section with a measurement beam, measuring first position information of the first head using the first head and the first grating member, one of the first grating section and the first head being provided at the holding section and the other of the first grating section and the first head being provided at a movable body;
by a second measurement section, measuring second position information of the movable body provided with the other of the first grating section and the first head, with respect to a reference member serving as a reference of movement of the holding section in the first and the second directions; and
obtaining third position information, in the first and the second directions, of the holding section that holds the object with respect to the reference member, based on the first position information measured by the first measurement section and the second position information measured by the second measurement section,
wherein the moving the holding section includes moving the holding section with respect to the movable body in the first direction and moving the support section with respect to the movable body in the first direction, and
relatively moving the holding section with respect to the support section in the second direction, and
the relatively moving the holding section with respect to the support section in the second direction includes moving the movable body in the second direction so that a facing arrangement of the first grating section and the first head is maintained during relative movement of the holding section with respect to the support section in the second direction.

13. The movement method of the object according to claim 12, wherein the second measurement section has a second grating section that has a measurement component in the second direction and a second head that irradiates the second grating section with a measurement beam, one of the second grating section and the second head being provided at the movable body and the other of the second grating section and the second head being provided at the reference member.

* * * * *